(12) United States Patent
Bai et al.

(10) Patent No.: US 12,289,978 B2
(45) Date of Patent: Apr. 29, 2025

(54) DISPLAY SUBSTRATE HAVING BARRIER LAYERS IN PERIPHERAL AREA, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Lu Bai, Beijing (CN); Yang Zhou, Beijing (CN); Xin Zhang, Beijing (CN); Junxiu Dai, Beijing (CN); Yi Zhang, Beijing (CN); Tinghua Shang, Beijing (CN); Bo Zhang, Beijing (CN); Yao Huang, Beijing (CN); Song Liu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/784,643

(22) PCT Filed: Aug. 17, 2021

(86) PCT No.: PCT/CN2021/112968
§ 371 (c)(1),
(2) Date: Jun. 11, 2022

(87) PCT Pub. No.: WO2023/019426
PCT Pub. Date: Feb. 23, 2023

(65) Prior Publication Data
US 2024/0172530 A1    May 23, 2024

(51) Int. Cl.
*H10K 59/80* (2023.01)
*H10K 59/131* (2023.01)

(52) U.S. Cl.
CPC ......... *H10K 59/873* (2023.02); *H10K 59/131* (2023.02)

(58) Field of Classification Search
CPC .. H10K 59/80; H10K 59/873; H10K 59/8731; H10K 59/131; H10K 59/12;
(Continued)

(56) References Cited

U.S. PATENT DOCUMENTS 6,400,080 B1    6/2002    Tanaka
11,209,859 B2*  12/2021   Yang ..................... H10K 50/84
(Continued)

FOREIGN PATENT DOCUMENTS

CN    105261712 A    1/2016
CN    107799665 A    3/2018
(Continued)

OTHER PUBLICATIONS

The Extended European Search Report in the European Patent Application No. 21953678.6, dated Mar. 11, 2024.
(Continued)

*Primary Examiner* — Thao X Le
*Assistant Examiner* — Timothy O Keegan
(74) *Attorney, Agent, or Firm* — Intellectual Valley Law, P.C.

(57) ABSTRACT

A display substrate includes at least two barrier layers in a peripheral area of the display substrate. The at least two barrier layers includes a first barrier layer forming an enclosure; and a third barrier layer on a side of the first barrier layer closer to a display area. The third barrier layer includes one or more discontinuous portions.

17 Claims, 26 Drawing Sheets

(58) Field of Classification Search
CPC .... H10K 59/125; H10K 59/124; H10K 59/17; H10K 59/179
See application file for complete search history.

(56) References Cited

U.S. PATENT DOCUMENTS

| | | | |
|---|---|---|---|
| 2015/0185960 A1* | 7/2015 | Kim .................... | G06F 3/04164 |
| | | | 345/175 |
| 2016/0064690 A1 | 3/2016 | Kook et al. | |
| 2017/0062534 A1 | 3/2017 | Jiang et al. | |
| 2018/0097198 A1* | 4/2018 | Chou .................... | H10K 59/873 |
| 2021/0202675 A1 | 7/2021 | Jang et al. | |
| 2021/0225992 A1* | 7/2021 | Long .................... | H10K 59/131 |
| 2021/0242294 A1* | 8/2021 | Bang .................... | H10K 50/844 |
| 2022/0028933 A1 | 1/2022 | He et al. | |

FOREIGN PATENT DOCUMENTS

| | | |
|---|---|---|
| CN | 112018159 A | 12/2020 |
| CN | 112820753 A | 5/2021 |
| CN | 113130597 A | 7/2021 |
| CN | 113130822 A | 7/2021 |
| CN | 113178536 A | 7/2021 |
| CN | 113206129 A | 8/2021 |
| EP | 3859810 A1 | 8/2021 |

OTHER PUBLICATIONS

International Search Report & Written Opinion mailed Apr. 21, 2022, regarding PCT/CN2021/112968.

* cited by examiner

DISPLAY SUBSTRATE HAVING BARRIER LAYERS IN PERIPHERAL AREA, AND DISPLAY APPARATUS

CROSS-REFERENCE TO RELATED APPLICATION

This application is a national stage application under 35 U.S.C. § 371 of International Application No. PCT/CN2021/112968, filed Aug. 17, 2021, the contents of which are incorporated by reference in the entirety.

TECHNICAL FIELD

The present invention relates to display technology, more particularly, to a display substrate and a display apparatus.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD apparatus. An OLED display apparatus typically includes an anode, an organic layer including a light emitting layer, and a cathode. OLEDs can be either a bottom-emission type OLED or a top-emission type OLED.

SUMMARY

In one aspect, the present disclosure provides a display substrate, comprising at least two barrier layers in a peripheral area of the display substrate; wherein the at least two barrier layers comprise a first barrier layer forming an enclosure; and a third barrier layer on a side of the first barrier layer closer to a display area; wherein the third barrier layer comprises one or more discontinuous portions.

Optionally, the third barrier layer comprises at least a first portion; and the first portion is in a peripheral sub-area is which at least a signal line layer is absent.

Optionally, the first portion is in a peripheral sub-area in which a first signal lane layer, a second signal line layer, and an anode material layer are absent.

Optionally, the first barrier layer father comprises at least a second portion outside the peripheral sub-area; the first portion and the second portion each comprises at least one common insulating sub-layer; and the second portion comprises at least one metallic sub-layer that is absent is the first portion.

Optionally, the display substrate comprises a staggered structure; wherein the staggered structure comprises at least a portion of the third barrier layer and at least one branch barrier; and the portion of the third barrier layer and the at least one branch barrier are staggered with respect to each other.

Optionally, the display substrate further comprises a second barrier layer in the peripheral area; wherein the staggered structure further comprises a portion of the second barrier layer; and the at least one branch barrier connected to and extending away from the second barrier layer.

Optionally, the third barrier layer comprises at least a first portion and a second portion discontinued from each other; and the portion of the second barrier layer that is part of the staggered structure is in a region between the first position and the second portion where the third barrier layer is discontinued.

Optionally, the at least one branch barrier comprises a first branch barrier and a second branch barrier respectively connected to and extending away from the position of the second barrier layer that is part of the staggered structure; wherein, in the staggered structure, the first portion and the first branch barrier are staggered with respect to each other; and the second portion and the second branch barrier are staggered with respect to each other.

Optionally, the display substrate further comprises a second barrier layer in the peripheral area; wherein the third barrier layer comprises at least a first portion; and the first portion is between a portion of the first barrier layer and the second barrier layer.

Optionally, the second barrier layer is connected to the first barrier layer; and the second barrier layer and the portion of the first barrier layer form a sub-enclosure enclosing the first portion.

Optionally, the second barrier layer is along an edge of at least a signal line layer; and the second barrier layer is in contact with the signal line layer.

Optionally, the display substrate further comprises at least one branch barrier connected to and extending away from the second barrier layer; wherein a respective branch barrier comprises a first segment and a second segment, and extension directions of the first segment and the second segment are different from each other; wherein the third barrier layer comprises a first end segment and a first main segment; and extension directions of the first end segment and the first main segment are different from each other, wherein extension directions of the first segment and the first main segment are substantially parallel to each other; and extension directions of the second segment and the first end segment are substantially parallel to each other.

Optionally, in plan view of the display substrate, an extension direction of the second segment is more toward the first main segment relative to an extension direction of the first segment; and in plan view of the display substrate, an extension direction of the first end segment is more toward the first segment relative to an extension direction of the first main segment.

Optionally, the display substrate further comprises at least a first branch barrier and a second branch barrier connected to and extending away from the second barrier layer, respectively; wherein the first branch barrier is inside a sub-enclosure formed by the second barrier layer and the portion of the first barrier layer enclosing the first portion; and the second branch barrier is outside the sub-enclosure.

Optionally, the display substrate further comprises at least a first branch barrier and a second branch barrier connected to and extending away from the second barrier layer, respectively; wherein extension lengths of the first branch barrier and the second branch barrier are different from each other.

Optionally, the first barrier layer comprises at least a first-first barrier portion and a second-first barrier portion; the first-first barrier portion and the second-first barrier portion each comprises a plurality of common insulating sub-layers; and the second-first barrier portion comprises at least one metallic sub-layer that is absent in the first-first barrier portion.

Optionally, the first-first barrier portion and a second barrier layer form a sub-enclosure enclosing a first portion of the third barrier layer.

Optionally, the display substrate further comprises a second barrier layer in the peripheral area; wherein the third barrier layer comprises a first portion, a second portion, and a third portion; and the first portion is spaced apart from the second portion by the second barrier layer, and spaced apart from the third portion by the second barrier layer.

Optionally, the second portion and the third portion are at least partially in two corner regions of the display substrate, respectively.

Optionally, the display substrate further comprises one or more branch barriers connected to and extending away from a portion of the second barrier layer where the first portion is spaced apart from the second portion; and one or more branch barriers connected to and extending away from a portion of the second barrier layer where the first portions is spaced apart from the third portion.

Is another aspect, the present disclosure provides a display apparatus, comprising the display substrate described herein or fabricated by a method described herein, and a sensor at least partially in a peripheral sub-area in which at least a signal line layer is absent.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display substrate and a display apparatus that substantially obviate one or more of the problems due to limitations and disadvantages of the related art. In one aspect, the present disclosure provides a display substrate. In some embodiments, the display substrate includes an encapsulating layer encapsulating a display unit in a display area; a first barrier layer in a peripheral area of the display substrate, forming a first enclosure enclosing a first area, the first area comprising the display area; and a second barrier layer in the peripheral area. Optionally, the second barrier layer is connected to the first barrier layer, partitioning the first area into a first sub-area entirely in the peripheral area and a second sub-area partially in the peripheral area and partially in the display area, the second barrier layer and a portion of the first barrier layer enclosing the first sub-area.

Figure 1A:
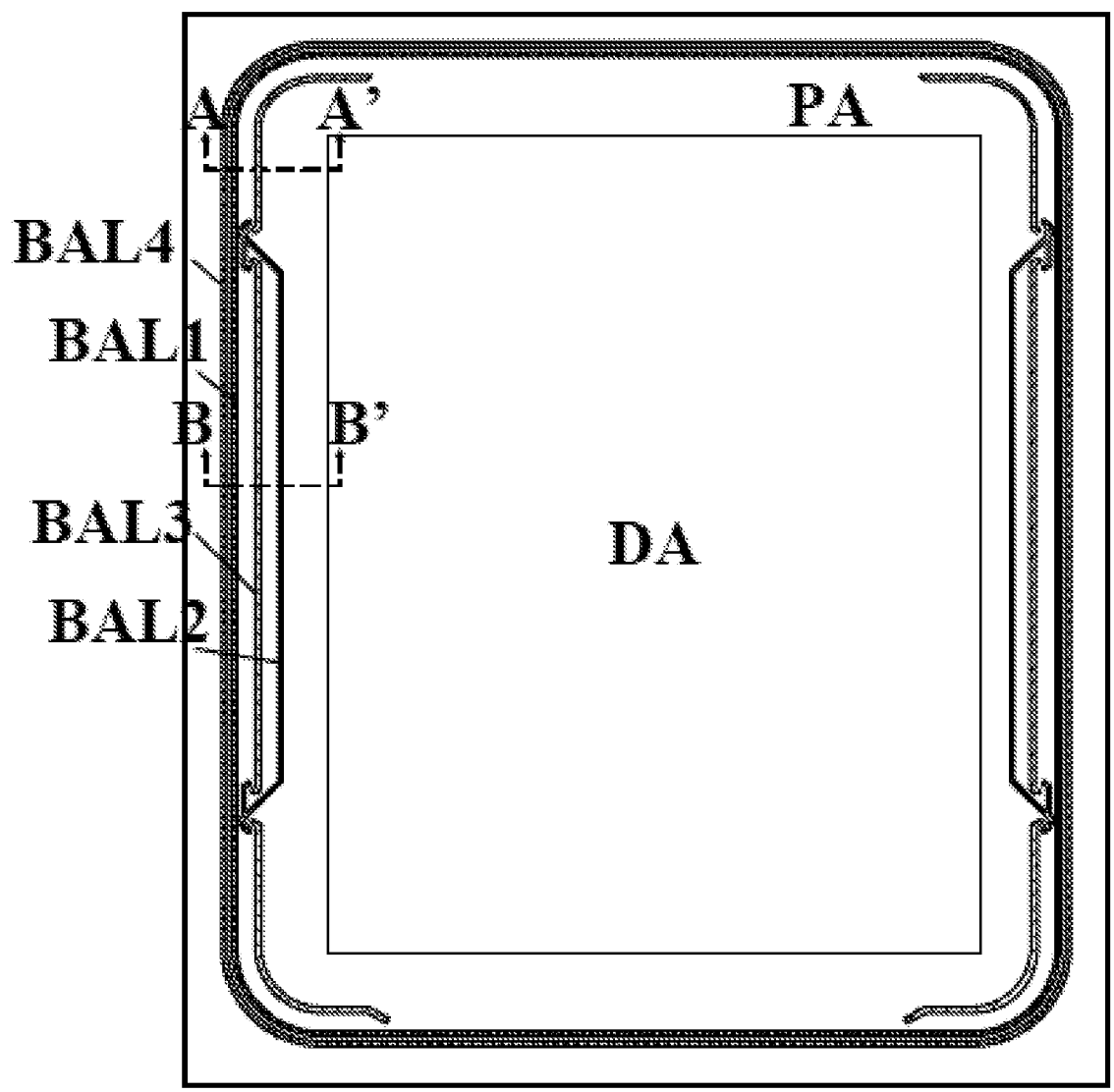
FIG. 1A is a schematic diagram illustrating the structure of a display substrate in some embodiments according to the present disclosure.

FIG. 1A is a schematic diagram illustrating the structure of a display substrate in some embodiments according to the present disclosure. Referring to FIG. 1A, the display substrate in some embodiments includes a display area DA and a peripheral area PA. As used herein, the term "display area" refers to an area of a display substrate (e.g., an opposing substrate or an array substrate) in a display panel where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to an area of a display substrate (e.g., as opposing substrate or an array substrate) in a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas.

In some embodiments, the display substrate includes an encapsulating layer encapsulating a display unit in the display area DA. Examples of the display unit includes a plurality of light emitting diodes such as a plurality of organic light emitting diodes respectively in a plurality of subpixels, a plurality of micro light emitting diodes respectively in a plurality of subpixels, a plurality of mini light emitting diodes respectively in a plurality of subpixels, and a plurality of quantum dots light emitting diodes respectively in a plurality of subpixels. A respective light emitting diode includes an anode, a light emitting layer, and a cathode. Referring to FIG. 1A, the display substrate further includes a first barrier layer BAL1 in a peripheral area PA of the display substrate, forming a first enclosure enclosing a first area. The first area encompasses the display area DA.

Figure 1B:
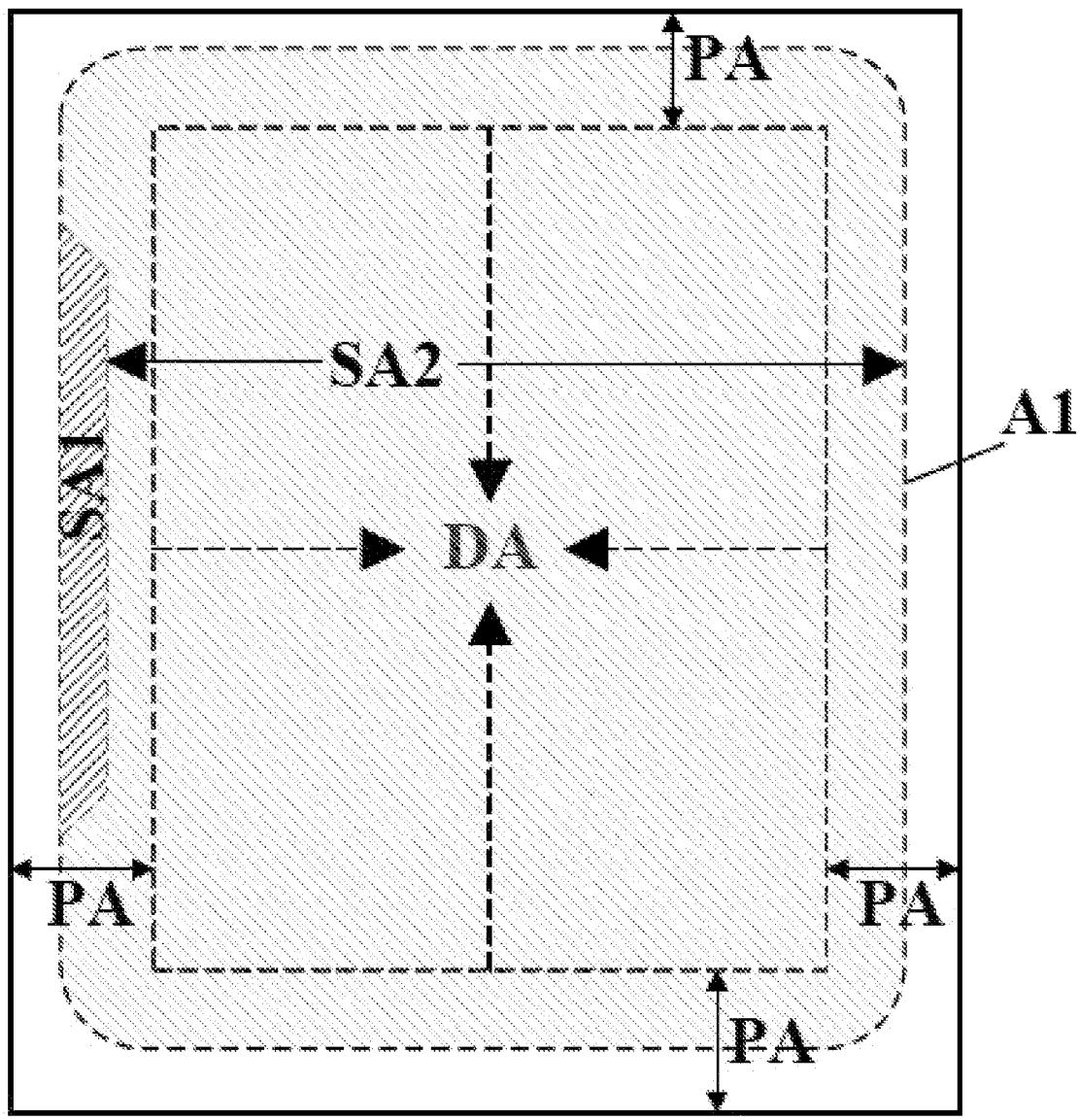
FIG. 1B is a schematic diagram illustrating relative positions of various areas and sub-areas of a display substrate in some embodiments according to the present disclosure.

FIG. 1B is a schematic diagram illustrating relative positions of various areas and sub-areas of a display substrate in some embodiments according to the present disclosure. Referring to FIG. 1A and FIG. 1B, the display substrate includes a display areas DA and a peripheral area PA, the peripheral area PA being outside of the display area DA. The first barrier layer BAL1 forms a first enclosure enclosing a first area A1. The first area A1 encompasses the display area DA, for example, the first area A1 includes the display area and a part of the peripheral area PA.

The display substrate in some embodiments further includes a second barrier layer BAL2 in the peripheral area PA. The second barrier layer BAL2 is connected to the first barrier layer BAL1, partitioning the first area A1 into a first sub-area SA1 entirely in the peripheral area PA and a second sub-area SA2 partially in the peripheral area PA and partially in the display area DA. The second barrier layer BAL2 and a portion of the first barrier layer BAL1 encloses the first sub-area SA1. Optionally, as shown in FIG. 1B, the second sub-area SA2 encompasses an entirety of the display area DA, the first sub-area SA1 is completely outside the display area DA.

Figure 1C:
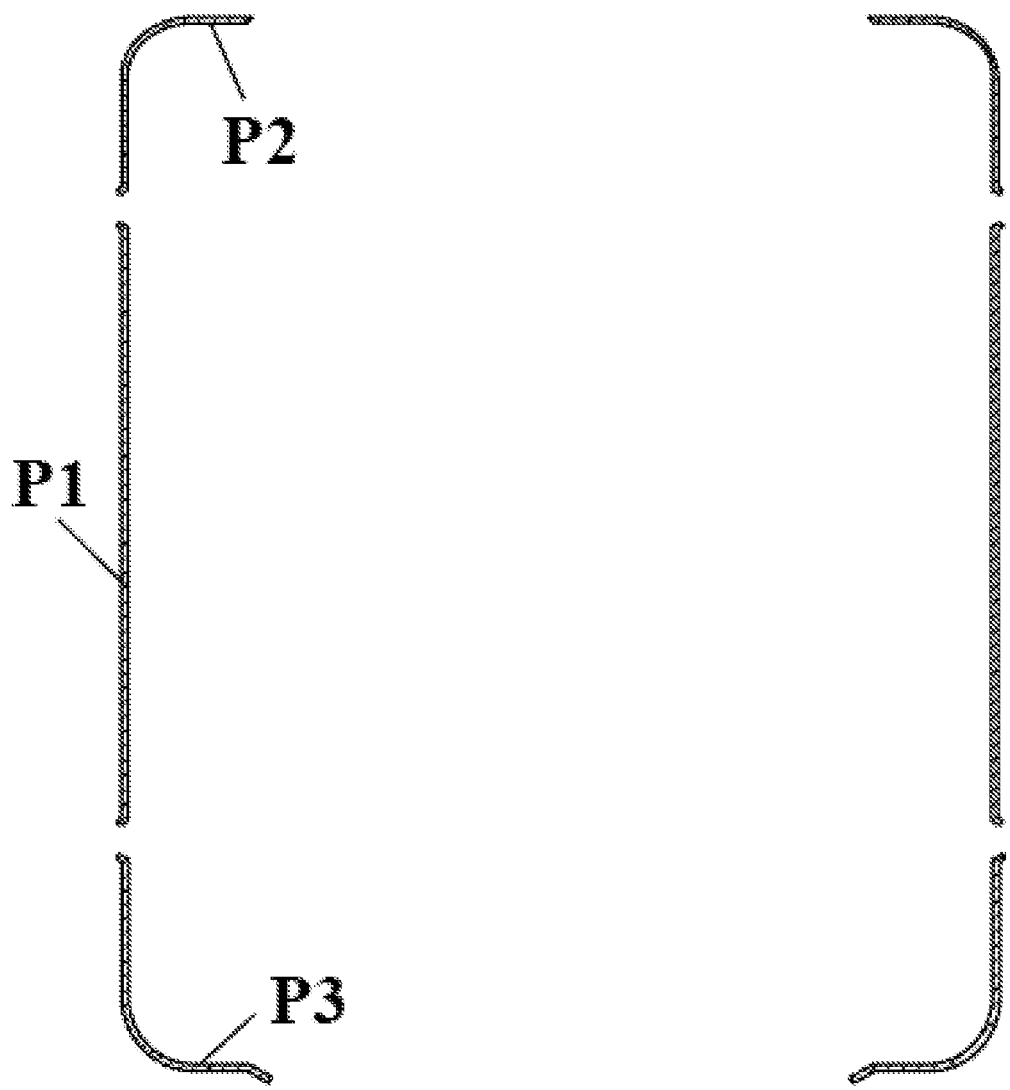
FIG. 1C is a schematic diagram illustrating the structure of a third barrier layer in some embodiments according to the present disclosure.
Figure 1D:
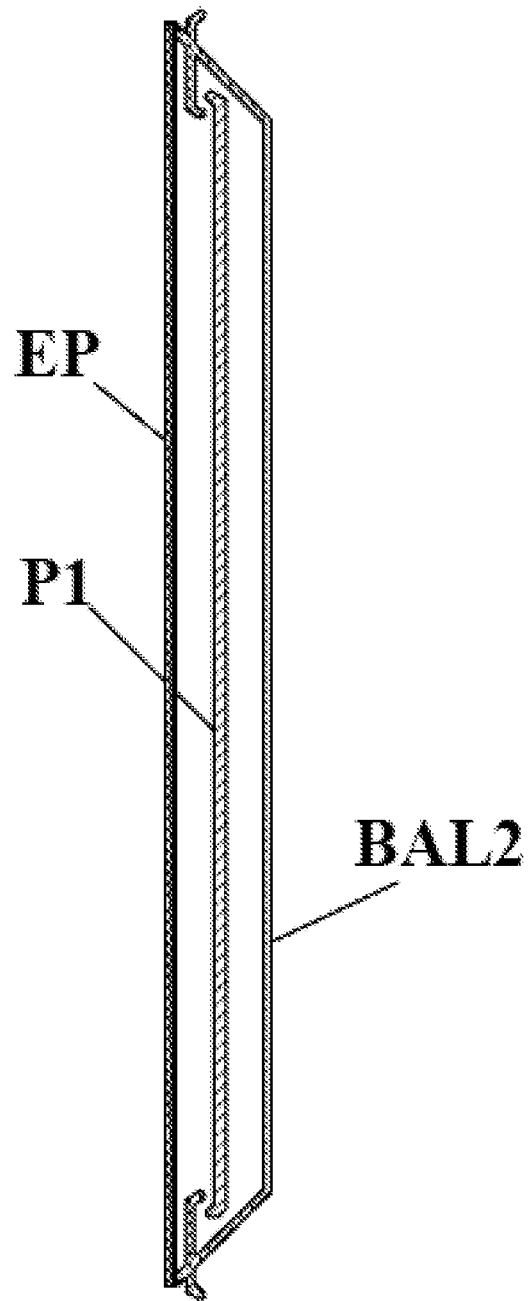
FIG. 1D is a schematic diagram illustrating a barrier layout in a first sub-area in some embodiments according to the present disclosure.

In some embodiments, the display substrate further includes a third barrier layer BAL3 in the peripheral area PA. FIG. 1C is a schematic diagram illustrating the structure of a third barrier layer in some embodiments according to the present disclosure. Referring to FIG. 1A to FIG. 1C, the third barrier layer BAL3 in some embodiments includes at least a first portion P1. As shown a FIG. 1A to FIG. 1C, the first portion P1 is entirely enclosed in the first sub-area SA1. The first portion P1 is spaced apart from the second barrier layer BAL2 and spaced apart from the first barrier layer BAL1. Optionally, a main portion of the first portion P1 extends along a direction substantially parallel to an extension direction of a main portion of the second barrier layer BAL2, substantially parallel to an extension direction of the portion of the first barrier layer BAL1 partially enclosing the first sub-area SA1. FIG. 1D is a schematic diagram illustrating a barrier layout in a first sub-area in some embodiments according to the present disclosure. Referring to FIG. 1D, an enclosing portion EP of the first barrier layer, the first portion P1 of the third barrier layer, and the second barrier layer BAL2 form a three-barrier structure in the first sub-area. The three-barrier structure, effectively preventing an ink printed on the display substrate (e.g., an ink for forming as organic encapsulating sub-layer of the encapsulating layer) during the fabrication process of the display substrate. As used herein, the term "substantially parallel" means that an angle is in the range of −10 degree to approximately 10 degrees, e.g., −10 degrees to approximately −8 degrees, −8 degrees to approximately −6 degrees, −6 degrees to approximately −4 degrees, −4 degrees to approximately −2 degrees, −2 degrees to approximately 0 degree, 0 degree to approximately 2 degrees, 2 degrees to approximately 4 degrees, 4 degrees to approximately 6 degrees, 6 degrees to approximately 8 degrees, or 8 degrees to approximately 10 degrees.

Figure 2A:
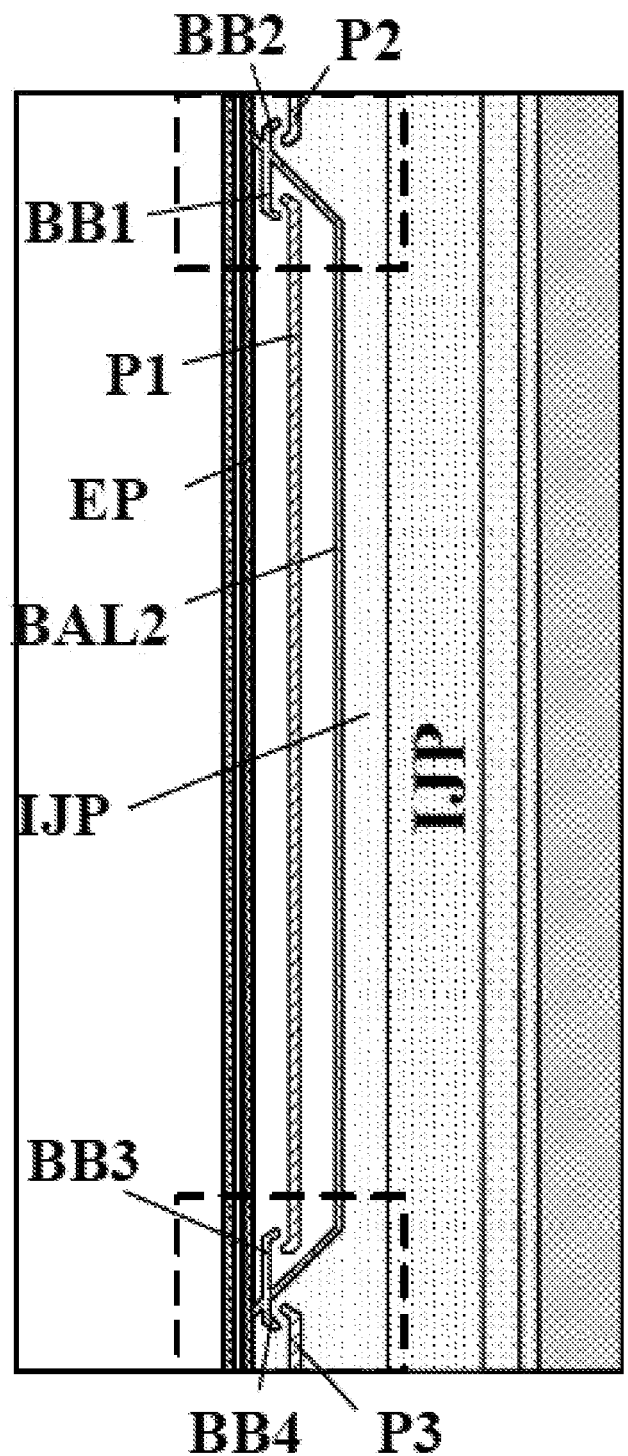
FIG. 2A is a zoom-in view of a region surrounding a second barrier layer in a display substrate in some embodiments according to the present disclosure.
Figure 2B:
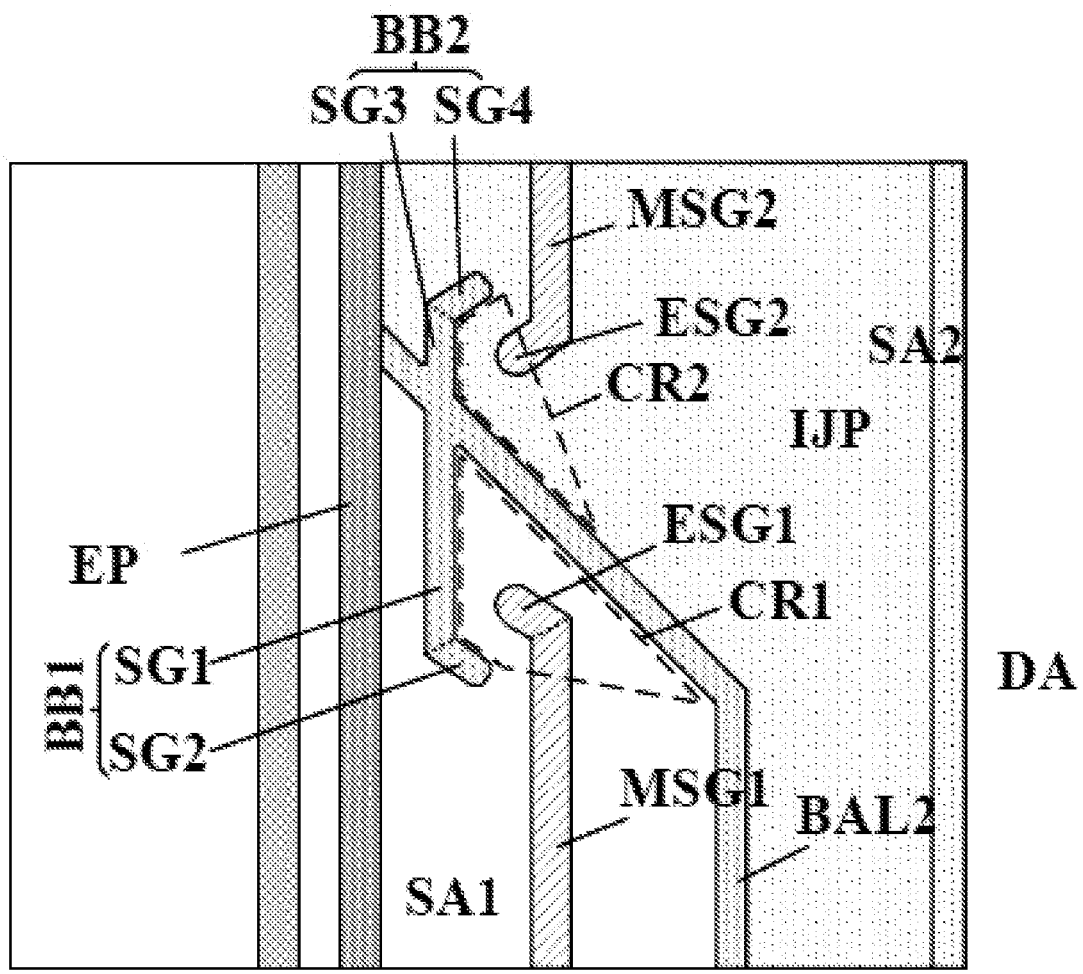
FIG. 2B is a zoom-in view of a first zoom-in region in FIG. 2A.

FIG. 2A is a zoom-in view of a region surrounding a second barrier layer in a display substrate in some embodiments according to the present disclosure. FIG. 2B is a zoom-in view of a first zoom-in region in FIG. 2A. Referring to FIG. 2A and FIG. 2B, the display substrate in some embodiments further includes a first branch barrier BB1 is the first sub-area SA1, the first branch barrier BB1 connected to the second barrier layer BAL2. The first branch barrier BB1 branches out of the second barrier layer BAL2. In one example as shown in FIG. 2A and FIG. 2B, the first branch barrier BB1 branches out of the second barrier layer BAL2 at least initially along a direction substantially parallel to the extension direction of the enclosing portion EP of the first barrier layer.

In some embodiments, the first portion P1 includes a first end segment ESG1. The first end segment ESG1 at least partially extends into a first corner region CR1 between the first branch barrier BB1 and a portion of the second barrier layer BAL2. The portion of the second barrier layer BAL2 is at an inclined angle with respect to the enclosing portion EP of the first barrier layer.

Is some embodiments, the first branch barrier BB1 includes at least a first segment SG1 and a second segment SG2. Optionally, the second segment SG2 is indirectly connected to the second barrier layer BAL2. In one example, the second segment SG2 is connected to the second barrier layer BAL2 through at least the first segment SG1. In another example as shown in FIG. 24, the first segment SG1 connects the second segment SG2 to the second barrier layer BAL2.

In some embodiments, is plan view of the display substrate, an extension direction of the second segment SG2 is more toward the display areas DA relative to an extension direction of the first segment SG1. In one example, the first segment SG1 and the second segment SG2 are linear segments, and the first segment SG1 and the second segment SG2 are at an included angle with respect to each other in a range of 95 degrees to 175 degrees, e.g., 95 degrees to 105 degrees, 105 degrees to 115 degrees, 115 degrees to 125 degrees, 125 degrees to 135 degrees, 135 degrees to 145 degrees, 145 degrees to 155 degrees, 155 degrees to 165 degrees, or 165 degrees to 175 degrees. Optionally, the first segment SG1 and the second segment SG2 are at an included angle in a range of 130 degrees to 140 degrees, e.g., 135 degrees.

Referring to FIG. 2A and FIG. 2B, in some embodiments, the first portion P1 further includes a first main segment MSG1 connected to the first end segment ESG1. The first main segment MSG1 at least partially outside the first corner region CR1.

In some embodiments, in plan view of the display substrate, an extension direction of the first end segment ESG1 is more away from the display area DA relative to an extension direction of the first main segment MSG1. Is one example, the first end segment ESG1 and the first main segment MSG1 are linear segments, and the first end segment ESG1 and the first main segment MSG1 are at an included angle with respect to each other in a range of 95 degrees to 175 degrees, e.g., 95 degrees to 105 degrees, 105 degrees to 115 degrees, 115 degrees to 125 degrees, 125 degrees to 135 degrees, 135 degrees to 145 degrees, 145 degrees to 155 degrees, 155 degrees to 165 degrees, or 165 degrees to 175 degrees. Optionally, the first end segment ESG1 and the first main segment MSG1 are at an included angle in a range of 130 degrees to 140 degrees, e.g., 135 degrees.

In some embodiments, in plan view of the display substrate, as extension direction of the second segment SG2 is more toward the first main segment MSG1 relative to an extension direction of the first segment SG1; and in plan view of the display substrate, an extension direction of the first end segment ESG1 is more toward the first segment SG1 relative to an extension direction of the first main segment MSG1. Optionally, the extension direction of the first segment SG1 and the extension direction of the first main segment MSG1 are substantially parallel to each other. Optionally, the extension direction of the second segment SG1 and the extension direction of the first end segment ESG1 are substantially parallel to each other.

Referring to FIG. 1A to FIG. 1C, and FIG. 2A, the third barrier layer BAL3 in some embodiments further includes a second portion P2 partially surrounding the display areas DA. The first portion P1 and the second portion P2 are spaced apart by the second barrier layer BAL2. The second portion P2 is in the second sub-area SA2 and outside the first sub-area SA1. The second portion P2 is spaced apart from the second barrier layer BAL2.

Referring to FIG. 2A and FIG. 2B, the display substrate in some embodiments further includes a second branch barrier BB2 in the first sub-area SA1. The second branch barrier BB2 is connected to the second barrier layer BAL2. The second branch barrier BB2 branches out of the second barrier layer BAL2. In one example as shown in FIG. 24 and FIG. 2B, the second branch barrier BB2 branches out of the second barrier layer BAL2 at least initially along a direction substantially parallel to the extension direction of the enclosing portion EP of the first barrier layer.

In some embodiments, the second portion P2 includes a second end segment ESG2. The second end segment ESG2 at least partially extends into a second corner region CR2 between the second branch barrier BB2 and a portion of the second barrier layer BAL2. The portion of the second barrier layer BAL2 is at an inclined angle with respect to the enclosing portion EP of the first barrier layer.

In some embodiment, the second branch barrier BB2 includes at least a third segment SG3 and a fourth segment SG4. Optionally, the fourth segment SG4 is indirectly connected to the second barrier layer BAL2. In one example, the fourth segment SG4 is connected to the second barrier layer BAL2 through at least the third segment SG3. Is another example as shown in FIG. 2B, the third segment SG3 connects the fourth segment SG4 to the second barrier layer BAL2.

In some embodiments, in plan view of the display substrate, an extension direction of the fourth segment SG4 is more toward the display area DA relative to an extension direction of the third segment SG3. In one example, the third segment SG3 and the fourth segment SG4 are linear segments, and the third segment SG3 and the fourth segment SG4 are at an included angle with respect to each other in a range of 95 degrees to 175 degrees, e.g., 95 degrees to 105 degrees, 105 degrees to 115 degrees, 115 degrees to 125 degrees, 125 degrees to 135 degrees, 135 degrees to 145 degrees, 145 degrees to 155 degrees, 155 degrees to 165 degrees, or 165 degrees to 175 degrees. Optionally, the third segment SG3 and the fourth segment SG4 are at as included angle is a range of 130 degrees to 140 degrees, e.g., 135 degrees.

Referring to FIG. 24 and FIG. 2B, in some embodiments, the second portion P2 further includes a second main segment MSG2 connected to the second end segment ESG2. The second main segment MSG2 at least partially outside the second corner region CR2.

In some embodiments, in plan view of the display substrate, an extension direction of the second end segment ESG2 is more away from the display area DA relative to an extension direction of the second main segment MSG2. Is one example, the second end segment ESG1 and the second main segment MSG2 are linear segments, and the second end segment ESG2 and the second main segment MSG2 are at an included angle with respect to each other in a range of 95 degrees to 175 degrees, e.g., 95 degrees to 105 degrees, 105 degrees to 115 degrees, 115 degrees to 125 degrees, 125 degrees to 135 degrees, 135 degrees to 145 degrees, 145 degrees to 155 degrees, 155 degrees to 165 degrees, or 165 degrees to 175 degrees. Optionally, the second end segment ESG2 and the second main segment MSG2 are at an included angle in a range of 130 degrees to 140 degrees, e.g., 135 degrees.

In some embodiments, in plan view of the display substrate, an extension direction of the fourth segment SG4 is more toward the second main segment MSG2 relative to an extension direction of the third segment SG3; and in plan view of the display substrate, an extension direction of the second end segment ESG2 is more toward the third segment SG3 relative to an extension direction of the second main segment MSG2. Optionally, the extension direction of the third segment SG3 and the extension direction of the second main segment MSG2 are substantially parallel to each other. Optionally, the extension direction of the fourth segment SG4 and the extension direction of the second end segment ESG2 are substantially parallel to each other.

Referring to FIG. 1A to FIG. 1C, and FIG. 2A, the third barrier layer BAL3 in some embodiments further includes a third portion P3 partially surrounding the display areas DA. The first portion P1 and the third portion P3 are spaced apart by the second barrier layer BAL2. The third portion P3 is in the second sub-area SA2 and outside the first sub-area SA1. The third portion P3 is spaced apart from the second barrier layer BAL2. As shown in FIG. 2A and FIG. 2B, the second portion P2 and the third portion P3 are on two sides of the first sub-area SA1.

Figure 2C:
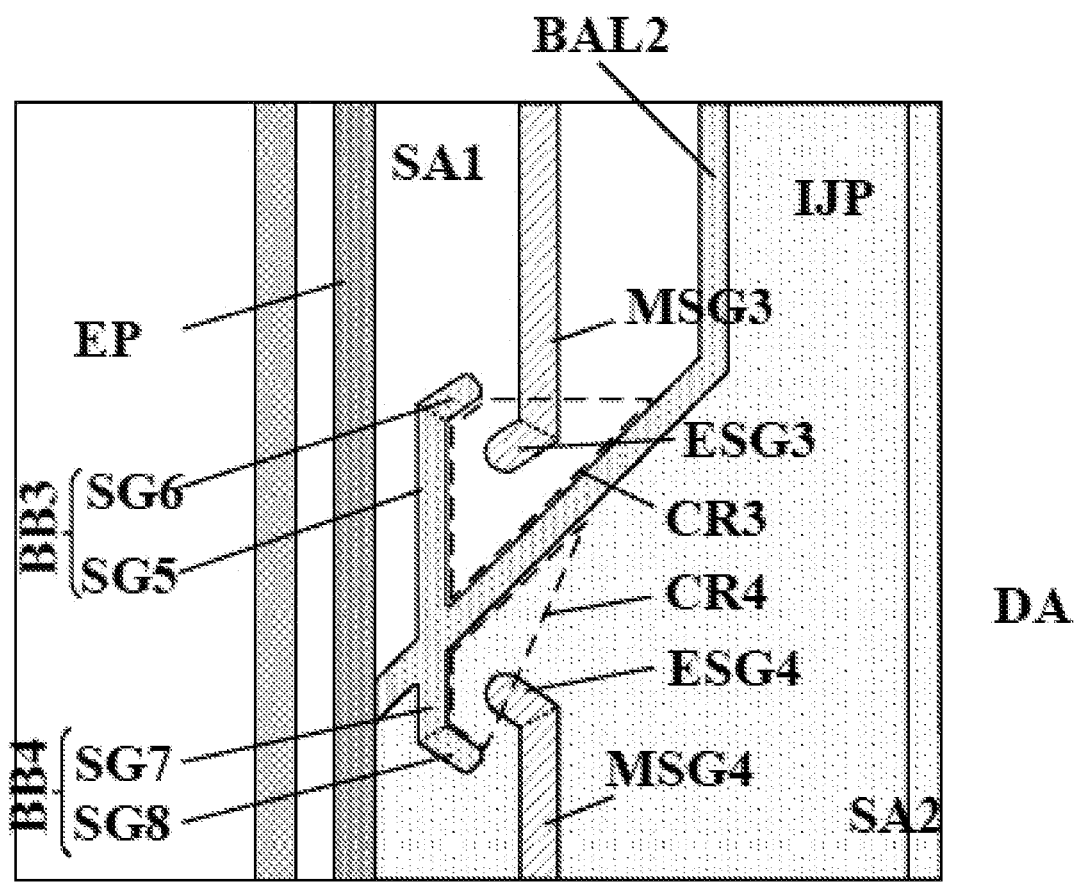
FIG. 2C is a zoom-in view of a second zoom-in region in FIG. 2A.

FIG. 2C is a zoom-in view of a second zoom-in region in FIG. 2A. Referring to FIG. 2A and FIG. 2C, the display substrate in some embodiments further includes a third branch barrier BB3 in the first sub-area SA1, the third branch barrier BB3 connected to the second barrier layer BAL2. The third branch barrier BB3 branches out of the second barrier layer BAL2. Is one example as shown in FIG. 2A and FIG. 2C, the third branch barrier BB3 branches out of the second barrier layer BAL2 at least initially along a direction substantially parallel to the extension direction of the enclosing portion EP of the first barrier layer.

In some embodiments, the first portion P1 further includes a third end segment ESG3. The third end segment ESG3 at least partially extends into a third corner region CR3 between the third branch barrier BB3 and a portion of the second barrier layer BAL2. The portion of the second barrier layer BAL2 is at an inclined angle with respect to the enclosing portion EP of the first barrier layer.

Is some embodiments, the first branch barrier BB3 includes at least a fifth segment SG5 and a sixth segment SG6. Optionally, the sixth segment SG6 is indirectly connected to the second barrier layer BAL2. In one example, the sixth segment SG6 is connected to the second barrier layer BAL2 through at least the fifth segment SG5. In another example as shown in FIG. 2A, the fifth segment SG5 connects the sixth segment SG6 to the second barrier layer BAL2.

In some embodiments, in plan view of the display substrate, an extension direction of the sixth segment SG6 is more toward the display area DA relative to an extension direction of the fifth segment SG5. In one example, the fifth segment SG5 and the sixth segment SG6 are linear segments, and the fifth segment SG5 and the sixth segment SG6 are at an included angle with respect to each other in a range of 95 degrees to 175 degrees, e.g., 95 degrees to 105 degrees, 105 degrees to 115 degrees, 115 degrees to 125 degrees, 125 degrees to 135 degrees, 135 degrees to 145 degrees, 145 degrees to 155 degrees, 155 degrees to 165 degrees, or 165 degrees to 175 degrees. Optionally, the fifth segment SG5 and the sixth segment SG6 are at an included angle in a range of 130 degrees to 140 degrees, e.g., 135 degrees.

Referring to FIG. 2A and FIG. 2C, in some embodiments, the first portion P1 further includes a third main segment MSG3 connected to the third end segment ESG3. The third main segment MSG3 at least partially outside the third corner region CR3. Optionally, the first main segment MSG1 and the third main segment MSG3 are parts of a unitary structure of the first portion P1. Optionally, the first main segment MSG1 and the third main segment MSG3 are colinear segments of the first portion P1. Optionally, the first main segment MSG1 and the third main segment MSG5 form a linear part of the first portion P1, the first end segment ESG1 and the third end segment ESG3 respectively connected to the linear part at two opposite end of the linear part.

In some embodiments, in plan view of the display substrate, an extension direction of the third end segment ESG3 is more away from the display area DA relative to as extension direction of the third main segment MSG3. In one example, the third end segment ESG3 and the third main segment MSG3 are respectively linear segments, and the third end segment ESG3 and the third main segment MSG3 are at an included angle with respect to each other in a range of 95 degrees to 175 degrees, e.g., 95 degrees to 105 degrees, 105 degrees to 115 degrees, 115 degrees to 125 degrees, 125 degrees to 135 degrees, 135 degrees to 145 degrees, 145 degrees to 155 degrees, 155 degrees to 165 degrees, or 165 degrees to 175 degrees. Optionally, the third end segment ESG3 and the third main segment MSG3 are at an included angle in a range of 130 degrees to 140 degrees, e.g., 135 degrees.

In some embodiments, in plan view of the display substrate, an extension direction of the sixth segment SG6 is more toward the third main segment MSG3 relative to an extension direction of the fifth segment SG5; and in plan view of the display substrate, an extension direction of the third end segment ESG3 is more toward the fifth segment SG5 relative to an extension direction of the third main segment MSG3. Optionally, the extension direction of the fifth segment SG5 and the extension direction of the third main segment MSG3 are substantially parallel to each other. Optionally, the extension direction of the sixth segment SG6 and the extension direction of the third end segment ESG3 are substantially parallel to each other.

Referring to FIG. 2A and FIG. 2C, the display substrate in some embodiments further includes a fourth branch barrier BB4 in the first sub-area SA1. The fourth branch barrier BB4 is connected to the second barrier layer BAL2. The fourth branch barrier BB4 branches out of the second barrier layer BAL2. In one example as shown in FIG. 2A and FIG. 2C, the fourth branch barrier BB4 branches out of the second barrier layer BAL2 at least initially along a direction substantially parallel to the extension direction of the enclosing portion EP of the first barrier layer.

In some embodiments, the third portion P3 includes a fourth end segment ESG4. The fourth end segment ESG4 at least partially extends into a fourth corner region CR4 between the fourth branch barrier BB4 and a portion of the second barrier layer BAL2. The portion of the second barrier layer BAL2 is at an inclined angle with respect to the enclosing position EP of the first barrier layer.

In some embodiments, the fourth branch barrier BB4 includes at least a seventh segment SG7 and an eighth segment SG8. Optionally, the eighth segment SG8 is indirectly connected to the second barrier layer BAL2. In one example, the eighth segment SG8 is connected to the second barrier layer BAL2 through at least the seventh segment SG7. In another example as shown in FIG. 2C, the seventh segment SG7 connects the eighth segment SG8 to the second barrier layer BAL2.

In some embodiments, in plan view of the display substrate, an extension direction of the eighth segment SG8 is more toward the display areas DA relative to an extension direction of the seventh segment SG7. In one example, the seventh segment SG7 and the eighth segment SG8 are linear segments, and the seventh segment SG7 and the eighth segment SG8 are at an included angle with respect to each other in a range of 95 degrees to 175 degrees, e.g., 95 degrees to 105 degrees, 105 degrees to 115 degrees, 115 degrees to 125 degrees, 125 degrees to 135 degrees, 135 degrees to 145 degrees, 145 degrees to 155 degrees, 155 degrees to 165 degrees, or 165 degrees to 175 degrees. Optionally, the seventh segment SG7 and the eighth segment SG8 are at an included angle in a range of 130 degrees to 140 degrees, e.g., 135 degrees.

Referring to FIG. 2A and FIG. 2C, in some embodiments, the third portion P3 further includes a fourth main segment MSG4 connected to the fourth end segment ESG4. The fourth main segment MSG4 at least partially outside the fourth corner region CR4.

In some embodiments, in plan view of the display substrate, an extension direction of the fourth end segment ESG4 is more away from the display area DA relative to an extension direction of the fourth main segment MSG4. In one example, the fourth end segment ESG4 and the fourth main segment MSG4 are linear segments, and the fourth end segment ESG4 and the fourth main segment MSG4 are at an included angle with respect to each other in a range of 95 degrees to 175 degrees, e.g., 95 degrees to 105 degrees, 105 degrees to 115 degrees, 115 degrees to 125 degrees, 125 degrees to 135 degrees, 135 degrees to 145 degrees, 145 degrees to 155 degrees, 155 degrees to 165 degrees, or 165 degrees to 175 degrees. Optionally, the fourth end segment ESG4 and the fourth main segment MSG4 are at an included angle in a range of 130 degrees to 140 degrees, e.g., 135 degrees.

In some embodiments, in plan view of the display substrate, an extension direction of the eighth segment SG8 is more toward the fourth main segment MSG4 relative to an extension direction of the seventh segment SG7; and in plan view of the display substrate, an extension direction of the fourth end segment ESG4 is more toward the seventh segment SG7 relative to an extension direction of the fourth main segment MSG4. Optionally, the extension direction of the seventh segment SG7 and the extension direction of the fourth main segment MSG4 are substantially parallel to each other. Optionally, the extension direction of the eighth segment SG8 and the extension direction of the fourth end segment ESG4 are substantially parallel to each other.

Figure 3A:
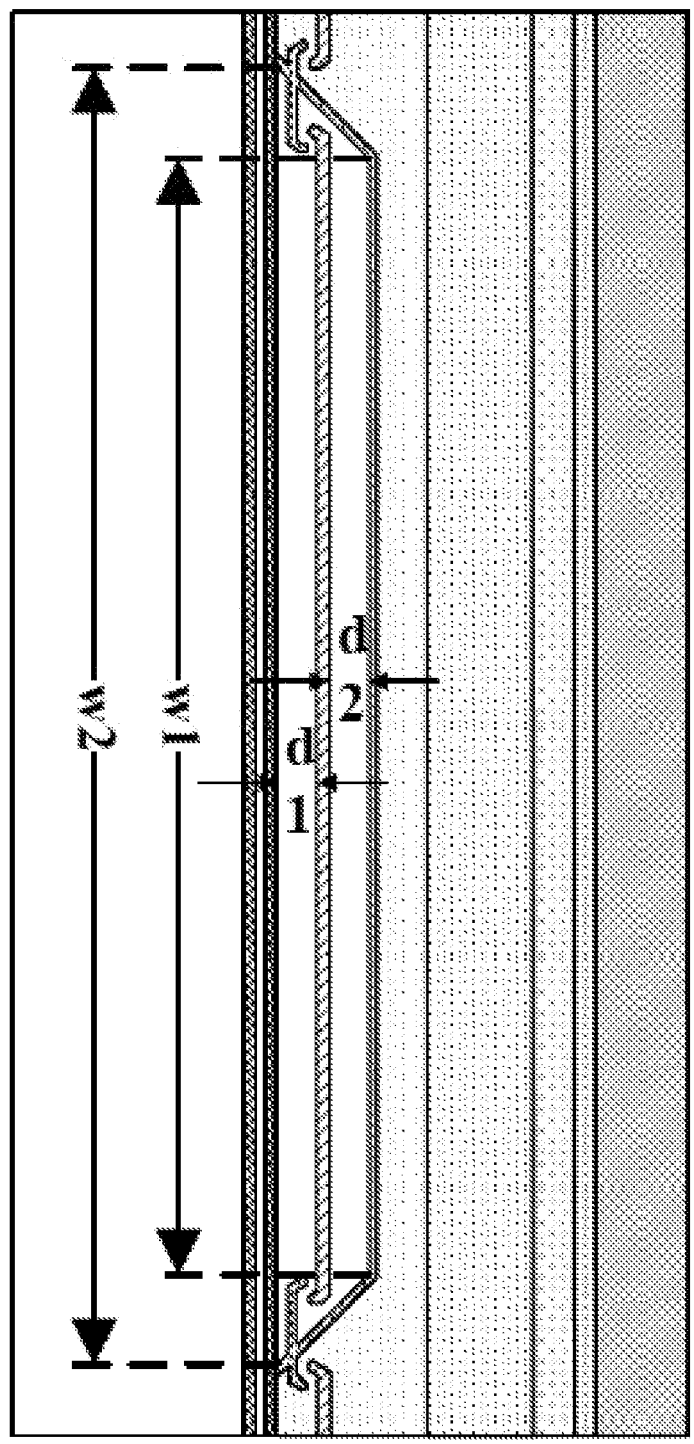
FIG. 3A is an annotation of FIG. 2A.

FIG. 3A is an annotation of FIG. 2A. Referring to FIG. 3A and FIG. 2A, in some embodiments, the first sub-area SA1 is a sub-area defined by the second barrier layer BAL2 and a portion of the first barrier layer BAL1, in which the organic encapsulating material sub-layer IJP is substantially absent (e.g., at least 80% absent, at least 85% absent, at least 90% absent, at least 95% absent, at least 99% absent, or 100% absent). In some embodiments, the first sub-area SA1 has a first width w1 of a side closer to the organic encapsulating material sub-layer IJP, and a second width w2 of a side away from the organic encapsulating material sub-layer IJP. Optionally, the first width w1 is less than the second width w2. Optionally, the first width w1 is a minimal wide of the first sub-area SA1 along the extension direction of the first portion P1. Optionally, the second width w2 is a maximum width of the first sub-area SA1 along the extension direction of the first portion P1.

In one example, the first width w1 is in a range of 3.5 mm to 4.5 mm, e.g., 3.5 mm to 3.7 mm, 3.7 am to 3.9 mm, 3.9 mm to 4.1 mm, 4.1 mm to 4.3 mm, or 4.3 mm to 4.5 mm. In another example, the second width w2 is in a range of 4.2 mm to 5.2 mm, e.g., 4.2 mm to 4.4 mm, 4.4 mm to 4.6 mm, 4.6 mm to 4.8 mm, 4.8 mm to 5.0 mm, or 5.0 mm to 5.2 mm. In another example, the first width w1 is in a range of 4.00 mm to 4.10 mm. In another example, the second width w2 is in a range of 4.74 mm to 4.84 mm.

In another example, a width of the first portion P1 along a direction perpendicular to the extension direction of the first portion P1 is in a range of 5 μm to 15 μm, e.g., 5 μm to 7 μm, 7 μm to 9 μm, 9 μm to 11 μm, 11 μm to 13 μm, or 13 μm to 15 μm. In one example, the width of the first portion P1 along the direction perpendicular to the extension direction of the first portion P1 is 9.90 μm to 10.10 μm.

In some embodiments, in a portion of the first sub-area SA1 where the first portion P1, the first barrier layer BAL1, and the second barrier layer BAL2 are substantially parallel to each other, the first portion P1 is spaced apart from the first barrier layer BAL1 by a first distance d1, and is spaced apart from the second barrier layer BAL2 by a second distance d2, along a direction intersecting and perpendicular to the first portion P1, the first barrier layer BAL1, and the second barrier layer BAL2.

In one example, the first distance d1 is in a range of 100 μm to 200 μm, e.g., 100 μm to 110 μm, 110 μm to 120 μm, 120 μm to 130 μm, 130 μm to 140 μm, 140 μm to 150 μm, 150 μm to 160 μm, 160 μm to 170 μm, 170 μm to 180 μm, 180 μm to 190 μm, or 190 μm to 200 μm. In another example, the second distance d2 is in a range of 100 μm to 200 μm, e.g., 100 μm to 110 μm, 110 μm to 120 μm, 120 μm to 130 μm, 130 μm to 140 μm, 140 μm to 150 μm, 150 μm to 160 μm, 160 μm to 170 μm, 170 μm to 180 μm, 180 μm to 190 μm, or 190 μm to 200 μm. In another example, the first distance d1 is in a range of 145 μm to 155 μm. In another example, the second distance d1 is in a range of 140 μm to 150 μm.

Figure 3B:
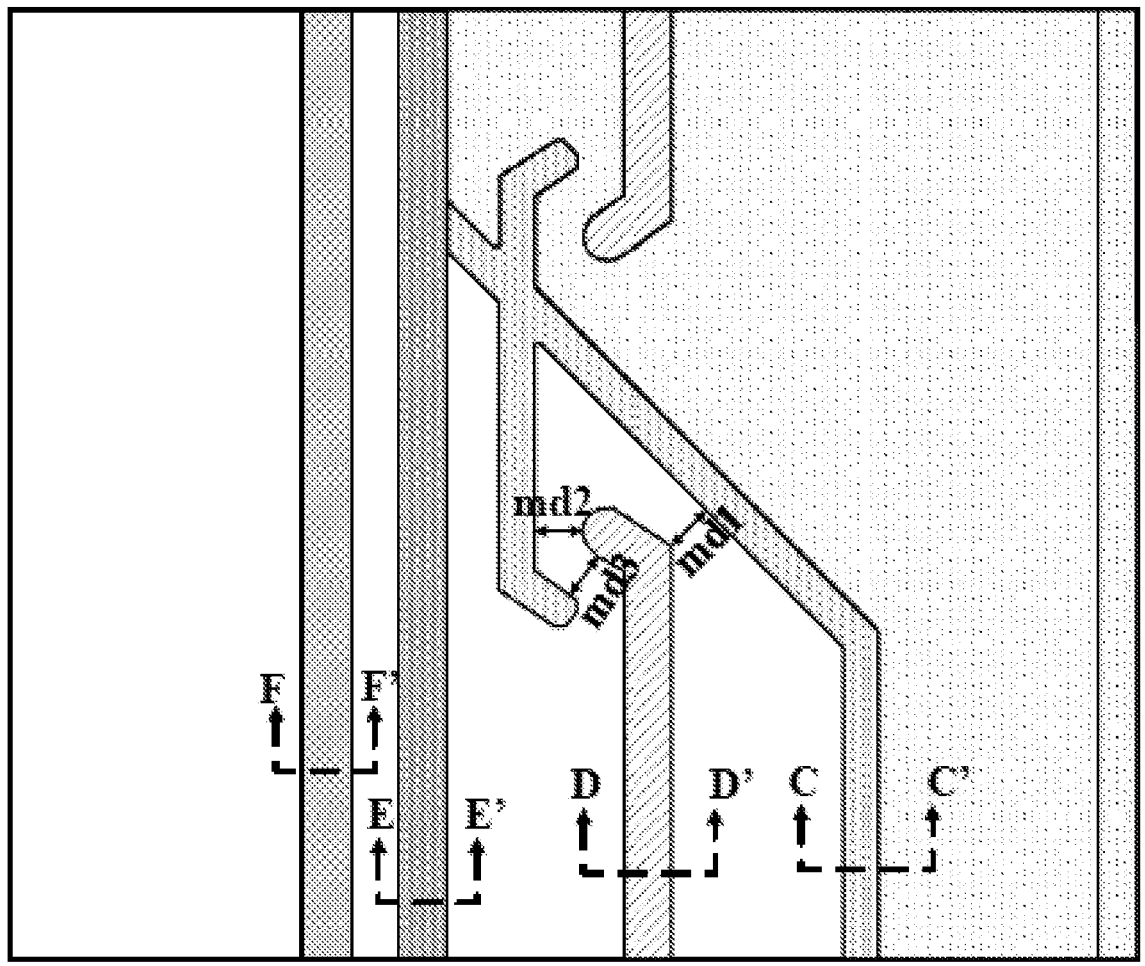
FIG. 3B is an annotation of FIG. 2B.

FIG. 3B is an annotation of FIG. 2B. Referring to FIG. 2B and FIG. 3B, in some embodiments, the first end segment ESG1 has a first minimal distance md1 to the second barrier layer BAL2, the first end segment ESG1 has a second minimal distance md1 to the first segment SG1, and the first end segment ESG1 has a third maximal distance md1 to the second segment SG2.

In one example, the first minimal distance md1 is in a range of 20 μm to 60 μm, e.g., 20 μm to 25 μm, 25 μm to 30 μm, 30 μm to 35 μm, 35 μm to 40 μm, 40 μm to 45 μm, 45 μm to 50 μm, 50 μm to 55 μm, or 55 μm to 60 μm. In another example, the first minimal distance md1 is in a range of 40 μm to 43 μm.

In one example, the second minimal distance md2 is in a range of 20 μm to 60 μm, e.g., 20 μm to 25 μm, 25 μm to 30 μm, 30 μm to 35 μm, 35 us to 40 μm, 40 μm to 45 μm, 45 μm to 50 μm, 50 μm to 55 μm, or 55 μm to 60 μm. In another example, the second minimal distance md2 is in a range of 38.5 μm to 41.5 μm.

In one example, the third maximal distance md3 is in a range of 20 μm to 60 μm, e.g., 20 μm to 25 μm, 25 μm to 30 μm, 30 μm to 35 μm, 35 μm to 40 μm, 40 μm to 45 μm, 45 μm to 50 μm, 50 μm to 55 μm, or 55 μm to 60 μm. In another example, the third minimal distance md3 is in a range of 39.5 μm to 42.0 μm.

Figure 3C:
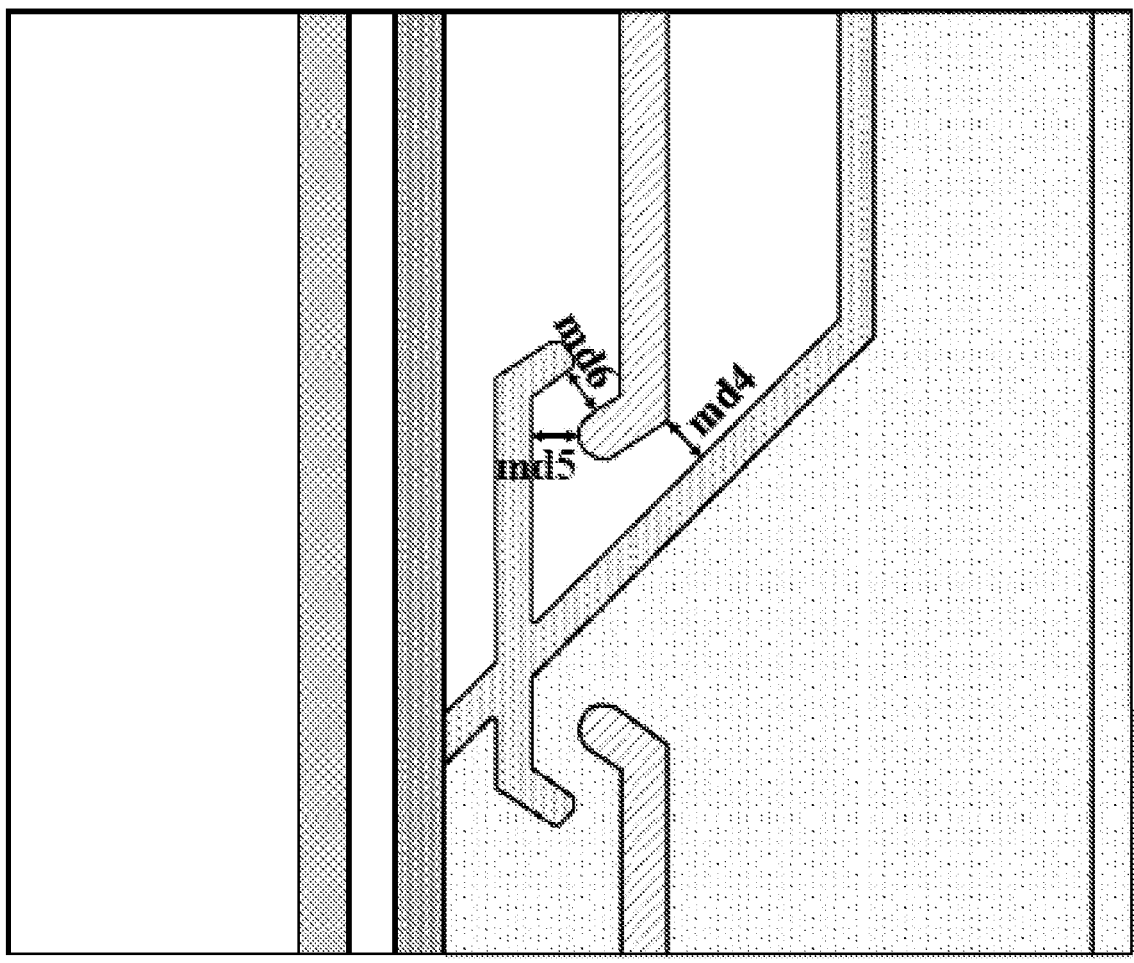
FIG. 3C is an annotation of FIG. 2C.

FIG. 3C is an annotation of FIG. 2C. Referring to FIG. 2C and FIG. 3C, in some embodiments, the third end segment ESG3 has a fourth minimal distance md4 to the second barrier layer BAL1, the third end segment ESG3 has a fifth minimal distance md5 to the fifth segment SG5, and the third end segment ESG3 has a sixth minimal distance md6 to the sixth segment SG6.

In one example, the fourth minimal distance md4 is in a range of 20 μm to 60 μm, e.g., 20 μm to 25 μm, 25 μm to 30 μm, 30 μm to 35 μm, 35 μm to 40 μm, 40 μm to 45 μm, 45 μm to 50 μm, 50 μm to 55 μm, or 55 μm to 60 μm. In another example, the fourth minimal distance md4 is in a range of 40 μm to 43 μm.

In one example, the fifth minimal distance md5 is in a range of 20 μm to 60 μm, e.g., 20 μm to 25 μm, 25 μm to 30 μm, 30 μm to 35 μm, 35 μm to 40 μm, 40 μm to 45 μm, 45 μm to 50 μm, 50 μm to 55 μm, or 55 μm to 60 μm. Is another example, the fifth minimal distance md5 is in a range of 38.5 μm to 41.5 μm.

In one example, the sixth minimal distance md6 is in a range of 20 μm to 60 μm, e.g., 20 μm to 25 μm, 25 μm to 30 μm, 30 μm to 35 μm, 35 μm to 40 μm, 40 μm to 45 μm, 45 μm to 50 μm, 50 μm to 55 μm, or 55 μm to 60 μm. In another example, the sixth minimal distance md6 is in a range of 39.5 μm to 42.0 μm.

In some embodiments, the encapsulating layer EN includes at least an organic encapsulating material sub-layer IJP. Optionally, the encapsulating layer EN further includes a first inorganic encapsulating material sub-layer CVD1 on a side of the organic encapsulating material sub-layer IJP closer to the base substrate BS. Optionally, the encapsulating layer EN further includes a second inorganic encapsulating material sub-layer CVD2 on a side of the organic encapsulating material sub-layer IJP away from the base substrate BS.

Figure 1E:
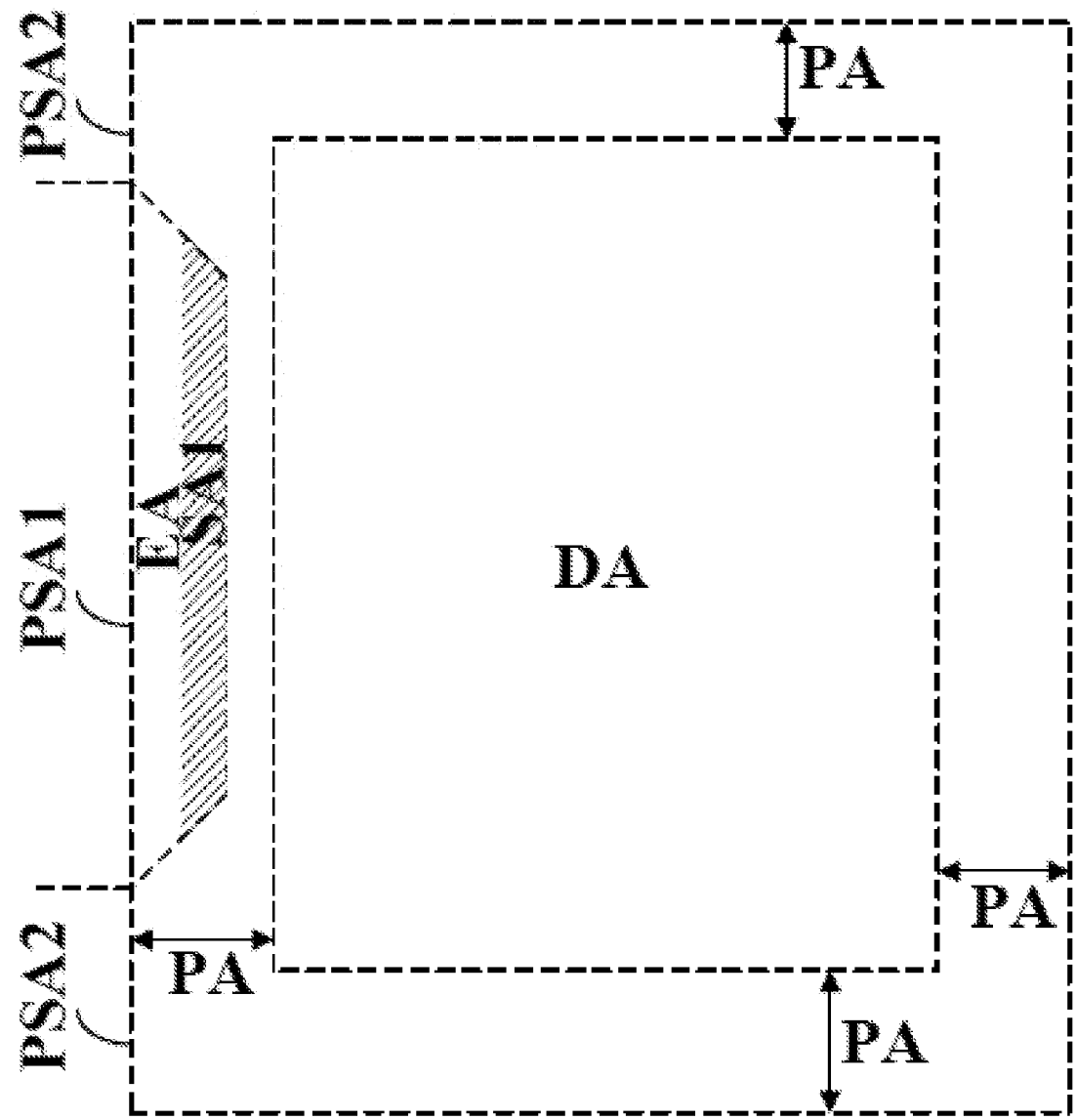
FIG. 1E is a schematic diagram illustrating a peripheral area in some embodiments according to the present disclosure.

FIG. 1E is a schematic diagram illustrating a peripheral area in some embodiments according to the present disclosure. Referring to FIG. 1E, in some embodiments, the peripheral area PA includes a first peripheral sub-area PSA1 and a second peripheral sub-area PSA2. The first peripheral sub-area PSA1 includes the first sub-area SA1, and as edge area EA directly adjacent to the first sub-area SA1 and on a side of the first sub-area SA1 away from the display area DA. Referring to FIG. 1A and FIG. 1E, a virtual line (e.g., the line denoted as B-B') extending along a direction from the edge areas EA to the display area DA intersects or crosses over, sequentially, the first barrier layer BAL1, the third barrier layer BAL3, and the second barrier layer BAL2.

The first peripheral sub-area PSA1 and the second peripheral sub-area PSA2 are mutually exclusive.

Figure 4:
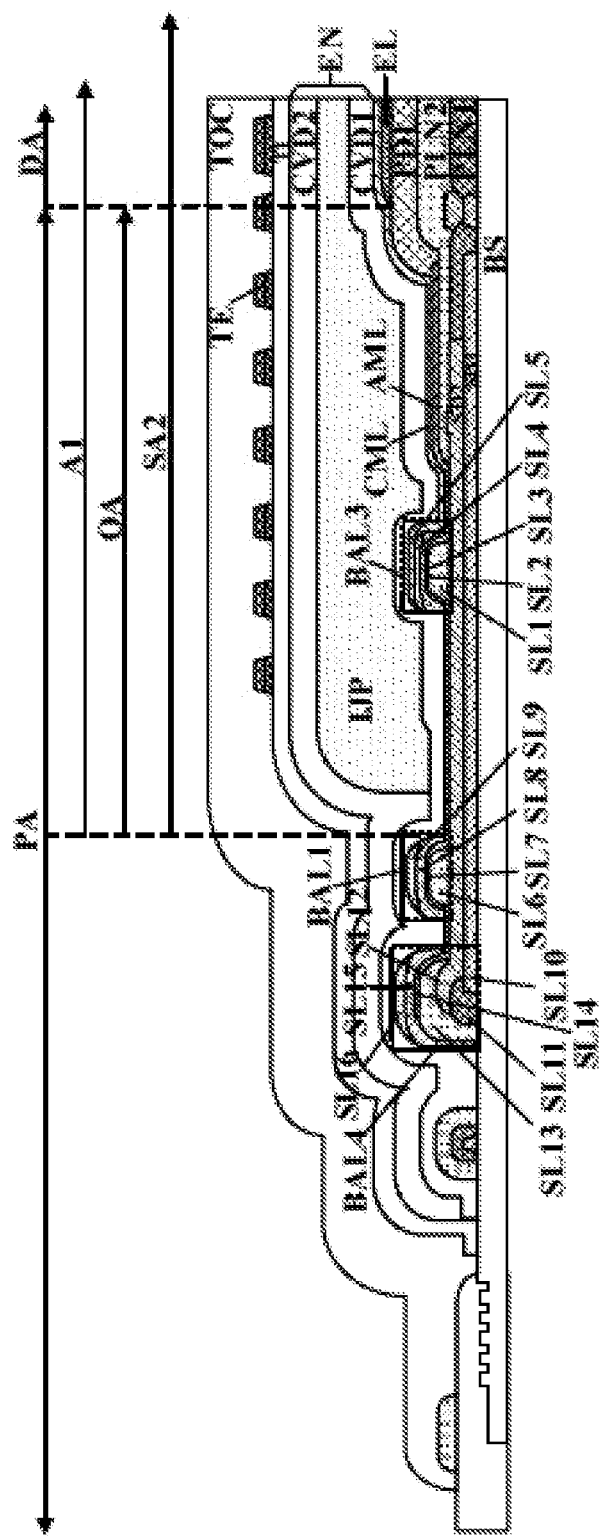
FIG. 4 is a cross-section along an A-A' line in FIG. 1A.
Figure 5:
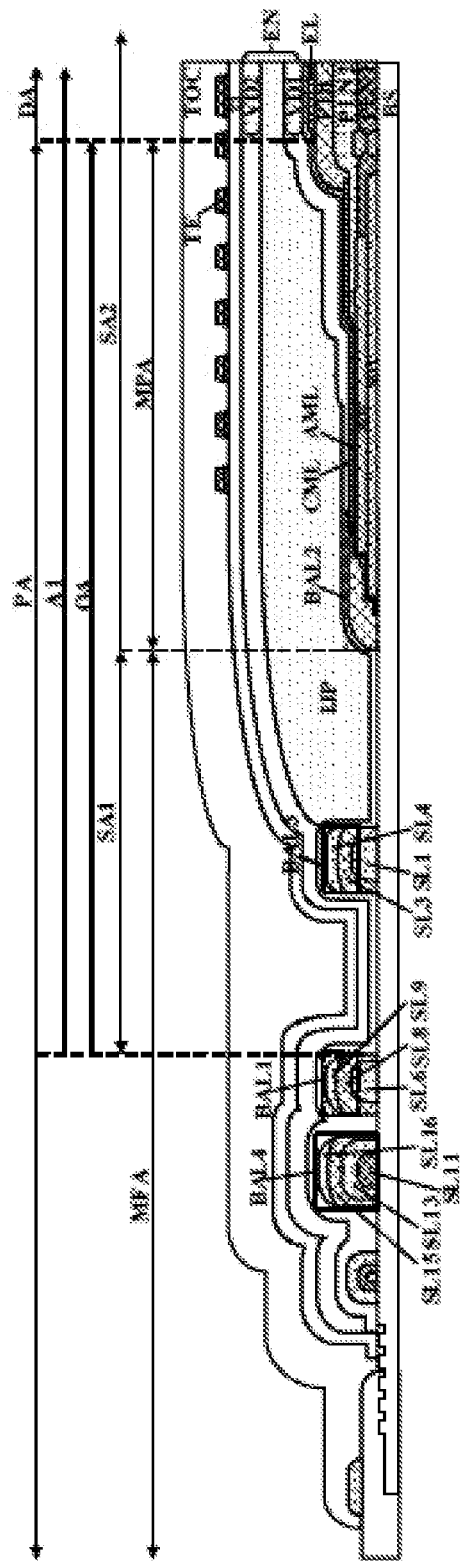
FIG. 5 is a cross-section along a B-B' line in FIG. 1A.

FIG. 4 is a cross-section along an A-A' line in FIG. 1A. FIG. 5 is a cross-section along a B-B' line in FIG. 1A. Referring to FIG. 4 and FIG. 5, in some embodiments, the display substrate in the display area DA includes a base substrate BS; a first signal line layer SD1 on the base substrate BS; a first planarization layer PLN1 on a side of the first signal line layer SD1 away from the base substrate BS; a second signal line layer SD2 on a side of the first planarization layer PLN1 away from the first signal line layer SD1; a second planarization layer PLN2 on a side of the second signal line layer SD2 away from the first planarization layer PLN1; an anode material layer AML on a side of the second planarization layer PLN2 away from the second signal line layer SD2; a pixel definition layer PDL on a side of the anode material layer AML away from the second planarization layer PLN2, the pixel definition layer PDL defining subpixel apertures configured to receive an organic light emitting material; an organic light emitting material layer EL on a side of the pixel definition layer PDL away from the anode material layer AML; a cathode material layer CML on a side of the organic light emitting material layer EL away from the anode material layer AML; as encapsulating layer EN on a side of the cathode material layer CML away from the organic light emitting material layer EL; a touch insulating layer TI on a side of the encapsulating layer EN away from the cathode material layer CML; a touch electrode layer TE on a side of the touch insulating layer TI away from the encapsulating layer EN; and an overcoat layer TOC on a side of the touch electrode layer TE away from the touch insulating layer TI.

In some embodiments, in the display area DA, the first signal line layer SD1 includes a plurality of signal lines such as a plurality of gate lines. In some embodiments, in the display area DA, the second signal line layer SD2 includes a plurality of signal lines such as a plurality of data lines. In some embodiments, in the display area DA, the anode material layer AML includes a plurality of anodes respectively of a plurality of light emitting diodes. In some embodiments, in the display area DA, the cathode material layer CML includes a cathode of one or more light emitting diodes.

Referring to FIG. 4, in some embodiments, in at least a portion of the second peripheral sub-area PSA2, the display substrate includes a base substrate BS; a first signal line layer SD1 on the base substrate BS; a first planarization layer PLN1 on a side of the first signal line layer SD1 away from the base substrate BS; a second signal line layer SD2 on a side of the first planarization layer PLN1 away from the first signal line layer SD1; a second planarization layer PLN2 on a side of the second signal line layer SD2 away from the first planarization layer PLN1; an anode material layer AML on a side of the second planarization layer PLN2 away from the second signal line layer SD2; a cathode material layer CML on a side of the anode material layer AML away from the second planarization layer PLN2; an encapsulating layer EN on a side of the cathode material layer CML away from the anode material layer AML; a touch insulating layer TI on a side of the encapsulating layer EN away from the cathode material layer CML; a touch electrode layer TE on a side of the touch insulating layer TI away from the encapsulating layer EN; and an overcoat layer TOC on a side of the touch electrode layer TE away from the touch insulating layer TI.

Referring to FIG. 4, in some embodiments, in at least a portion of the second peripheral sub-area PSA2, the third barrier layer BAL3 includes a stacked structure including a plurality of sub-layers stacked together. Referring to FIG. 4, in one example, the plurality of sub-layers of the stacked structure includes a first sub-layer SL1 in a same layer as the second planarization layer PLN2; a second sub-layer SL2 on a side of the first sub-layer SL1 away from the base substrate BS, the second sub-layer SL2 being in a same layer as the anode material layer AML; a third sub-layer SL3 on a side of the second sub-layer SL2 away from the first sub-layer SL1, the third sub-layer SL3 being in a same layer as the pixel definition layer PDL; a fourth sub-layer SL4 on a side of the third sub-layer SL3 away from the second sub-layer SL2, the fourth sub-layer SL4 being in a same layer as a spacer layer; and a fifth sub-layer SL5 on a side of the fourth sub-layer SL4 away from the third sub-layer SL3, the fifth sub-layer SL5 being in a same layer as the cathode material layer CML. Optionally, the display substrate includes a portion of the second signal line layer SD2 on a side of the first sub-layer SL1 closer to the base substrate BS. Optionally, the display substrate further includes a portion of the first signal line layer SD1 on a side of the portion of the second signal line layer SD2 away from the first sub-layer SL1 and closer to the base substrate BS. The spacer layer is made of an insulating material.

As used herein, the term "same layer" refers to the relationship between the layers simultaneously formed in the same step. In one example, the first sub-layer SL1 in a same layer as the second planarization layer PLN2 are in a same layer when they are formed as a result of one or more steps of a same patterning process performed in a material deposited in a same deposition process. In another example, the first sub-layer SL1 in a same layer as the second planarization layer PLN2 can be formed in a same layer by simultaneously performing the step of forming the first sub-layer SL1 and the step of forming the second planarization layer PLN2. The term "same layer" does not always mean that the thickness of the layer or the height of the layer in a cross-sectional view is the same.

The first barrier layer BAL1 enclosing the first area A1 in some embodiments includes a stacked structure including a plurality of sub-layers stacked together. Referring to FIG. 4, in at least a portion of the second peripheral sub-area PSA2, the plurality of sub-layers of the stacked structure includes a sixth sub-layer SL6 in a same layer as the second planarization layer PLN2; a seventh sub-layer SL7 on a side of the sixth sub-layer SL6 away for the base substrate BS, the seventh sub-layer SL7 being in a same layer as the anode material layer AML; an eighth sub-layer SL8 on a side of the seventh sub-layer SL7 away from the sixth sub-layer SL6, the eighth sub-layer SL8 being in a same layer as the pixel definition layer PDL; a ninth sub-layer SL9 on a side of the eighth sub-layer SL8 away from the seventh sub-layer SL7, the ninth sub-layer SL9 being in a same layer as a spacer layer.

Referring to FIG. 1A and FIG. 4, the display substrate in some embodiments further includes a fourth barrier layer BAL4. The fourth barrier layer BAL4 is in the peripheral area PA. The fourth barrier layer BAL4 forms an enclosure enclosing a second area which encompasses the first areas A1. In some embodiments, in at least a portion of the second peripheral sub-area PSA2, the fourth barrier layer BAL4 includes a stacked structure including a plurality of sub-layers stacked together. Referring to FIG. 4, is one example, the plurality of sub-layers of the stacked structure includes a tenth sub-layer SL10 on the base substrate BS, the tenth sub-layer SL10 being in a same layer as the first signal line layer SD1; an eleventh sub-layer SL11 on a side of the tenth sub-layer SL10 away from the base substrate BS, the eleventh sub-layer SL11 being in a same layer as the first planarization layer PLN1; a twelfth sub-layer SL12 on a side of the eleventh sub-layer SL11 away from the tenth sub-layer SL10, the twelfth sub-layer SL12 being in a same layer as the second signal line layer SD2; a thirteenth sub-layer SL13 on a side of the twelfth sub-layer SL12 away from the eleventh sub-layer SL11, the thirteenth sub-layer SL13 being in a same layer as the second planarization layer PLN2; a fourteenth sub-layer SL14 on a side of the thirteenth sub-layer SL13 away from the twelfth sub-layer SL12, the fourteenth sub-layer SL14 being in a same layer as the anode material layer AML; a fifteenth sub-layer SL15 on a side of the fourteenth sub-layer SL14 away from the thirteenth sub-layer SL13, the fifteenth sub-layer SL15 being in a same layer as the pixel definition layer PDL; a sixteenth sub-layer SL16 on side of the fifteenth sub-layer SL15 away from the fourteenth sub-layer SL14, the sixteenth sub-layer SL16 being in a same layer as a spacer layer.

Referring to FIG. 5, in some embodiments, in the first peripheral sub-area PSA1, the display substrate includes a base substrate BS; a first planarization layer PLN1 on the base substrate BS; a second planarization layer PLN2 on a side of the first planarization layer PLN1 away from the base substrate BS; an encapsulating layer EN on a side of the second planarization layer PLN2 away from the first planarization layer PLN1; a touch insulating layer TI on a side of the encapsulating layer EN away from the second planarization layer PLN2; a touch electrode layer TE on a side of the touch insulating layer TI away from the encapsulating layer EN; and an overcoat layer TOC on a side of the touch electrode layer TE away from the touch insulating layer TI.

In some embodiments, in the first peripheral sub-area PSA1, the third barrier layer BAL3 includes a stacked structure including a plurality of sub-layers stacked together. Referring to FIG. 5, in the first peripheral sub-area PSA1, the plurality of sub-layers of the stacked structure includes a first sub-layer SL1 in a same layer as the second planarization layer PLN2; a third sub-layer SL3 on a side of the first sub-layer SL1 away from the base substrate BS, the third sub-layer SL3 being in a same layer as the pixel definition layer PDL; a fourth sub-layer SL4 on a side of the third sub-layer SL3 away from the first sub-layer SL1, the fourth sub-layer SL4 being in a same layer as a spacer layer. Comparing the third barrier layer BAL3 in the first peripheral sub-area PSA1 (FIG. 5) and in the second peripheral sub-area PSA2 (FIG. 4), the second sub-layer SL2 (in a same layer as the anode material layer AML) and the fifth sub-layer SL5 (in a same layer as the cathode material layer CML) are substantially absent (e.g., at least 80% absent, at least 85% absent, at least 90% absent, at least 95% absent, at least 99% absent, or 100% absent) in the third barrier layer BAL3 in the first peripheral sub-area PSA1. Moreover, the first signal line layer SD1 and the second signal line layer SD2 are substantially absent (e.g., at least 80% absent, at least 85% absent, at least 90% absent, at least 95% absent, at least 99% absent, or 100% absent) in the first peripheral sub-area PSA1.

The first barrier layer BAL1 enclosing the first area A1 in some embodiments includes a stacked structure including a plurality of sub-layers stacked together. Referring to FIG. 5, in the first peripheral sub-area PSA1, the plurality of sub-layers of the stacked structure includes a sixth sub-layer SL6 in a same layer as the second planarization layer PLN2; an eighth sub-layer SL8 on a side of the sixth sub-layer SL6 away from the base substrate BS, the eighth sub-layer SL8 being in a same layer as the pixel definition layer PDL; a ninth sub-layer SL9 on a side of the eighth sub-layer SL8 away from the sixth sub-layer SL6, the ninth sub-layer SL9 being in a same layer as a spacer layer. Comparing the first barrier layer BAL1 in the first peripheral sub-area PSA1 (FIG. 5) and in the second peripheral sub-area PSA2 (FIG. 4), the seventh sub-layer SL7 (in a same layer as the anode material layer AML) is substantially absent (e.g., at least 80% absent, at least 85% absent, at least 90% absent, at least 95% absent, at least 99% absent, or 100% absent) in the first barrier layer BAL1 in the first peripheral sub-area PSA1. Moreover, the first signal line layer SD1 and the second signal line layer SD2 are substantially absent (e.g., at least 80% absent, at least 85% absent, at least 90% absent, at least 95% absent, at least 99% absent, or 100% absent) in the first peripheral sub-area PSA1.

Referring to FIG. 1A and FIG. 5, the display substrate in some embodiments further includes a fourth base layer BAL4. The fourth barrier layer BAL4 is in the peripheral area PA. The fourth barrier layer BAL4 forms an enclosure enclosing a second area which encompasses the first areas A1. In some embodiments, in the first peripheral sub-area PSA1, the fourth barrier layer BAL4 includes a stacked structure including a plurality of sub-layers stacked together. Referring to FIG. 5, in the first peripheral sub-area PSA1, the plurality of sub-layers of the stacked structure includes an eleventh sub-layer SL11 in a same layer as the first planarization layer PLN1; a thirteenth sub-layer SL13 on a side of the eleventh sub-layer SL11 away from the base substrate BS, the thirteenth sub-layer SL13 being in a same layer as the second planarization layer PLN2; a fifteenth sub-layer SL15 on a side of the thirteenth sub-layer SL13 away from the eleventh sub-layer SL11, the fifteenth sub-layer SL15 being in a same layer as the pixel definition layer PDL; a sixteenth sub-layer SL16 on side of the fifteenth sub-layer SL15 away from the thirteenth sub-layer SL13, the sixteenth sub-layer SL16 being in a same layer as a spacer layer. Comparing the fourth barrier layer BAL4 in the first peripheral sub-area PSA1 (FIG. 5) and in the second peripheral sub-area PSA2 (FIG. 4), the tenth sub-layer SL10 in a same layer as the first signal line layer SD1; the twelfth sub-layer SL12 in a same layer as the second signal line layer SD2; and the fourteenth sub-layer SL14 in a same layer as the anode material layer AML are substantially absent (e.g., at least 80% absent, at least 85% absent, at least 90% absent, at least 95% absent, at least 99% absent, or 100% absent) in the fourth barrier layer BAL4 in the first peripheral sub-area PSA1. Moreover, the first signal line layer SD1 and the second signal line layer SD2 are substantially absent (e.g., at least 80% absent, at least 85% absent, at least 90% absent, at least 95% absent, at least 99% absent, or 100% absent) in the first peripheral sub-area PSA1.

In some embodiments, the organic encapsulating material sub-layer is substantially (e.g., at least 80%, at least 85%, at least 90%, at least 95%, at least 99%, or 100%) contained in the second sub-area. By having the organic encapsulating material sub-layer contained in the second sub-area, the display substrate can still maintain a relatively excellent water-resistance and oxygen-resistance even if cracks of a small degree occurs in the second inorganic encapsulating material sub-layer. This is because the organic encapsulating material sub-layer is absent in the region having the cracks (e.g., between the first barrier layer and the fourth barrier layer), and water/oxygen is not prone to permeate into the display substrate absent of an organic material.

By having a third barrier layer in combination with the second barrier layer, the flow of the organic encapsulating material ink during the printing process can be stably controlled. In particular, a more planar organic encapsulating material sub-layer can be consistently formed in the peripheral area. By having a more planar organic encapsulating material sub-layer, the slope of an edge of the organic encapsulating material sub-layer in the peripheral area can be much reduced. The touch electrode layer formed near the edge of the organic encapsulating material sub-layer can be more reliably fabricated, avoiding line open or short issues in the touch electrode layer, particularly when the touch electrode is made of mesh lines.

In some embodiments, the organic encapsulating material sub-layer is substantially absent (e.g., at least 80% absent, at least 85% absent, at least 90% absent, at least 95% absent, at least 99% absent, or 100% absent) in the first sub-area SA1, is at least partially present in the second sub-area SA2, and is present throughout the display area DA.

Figure 6A:
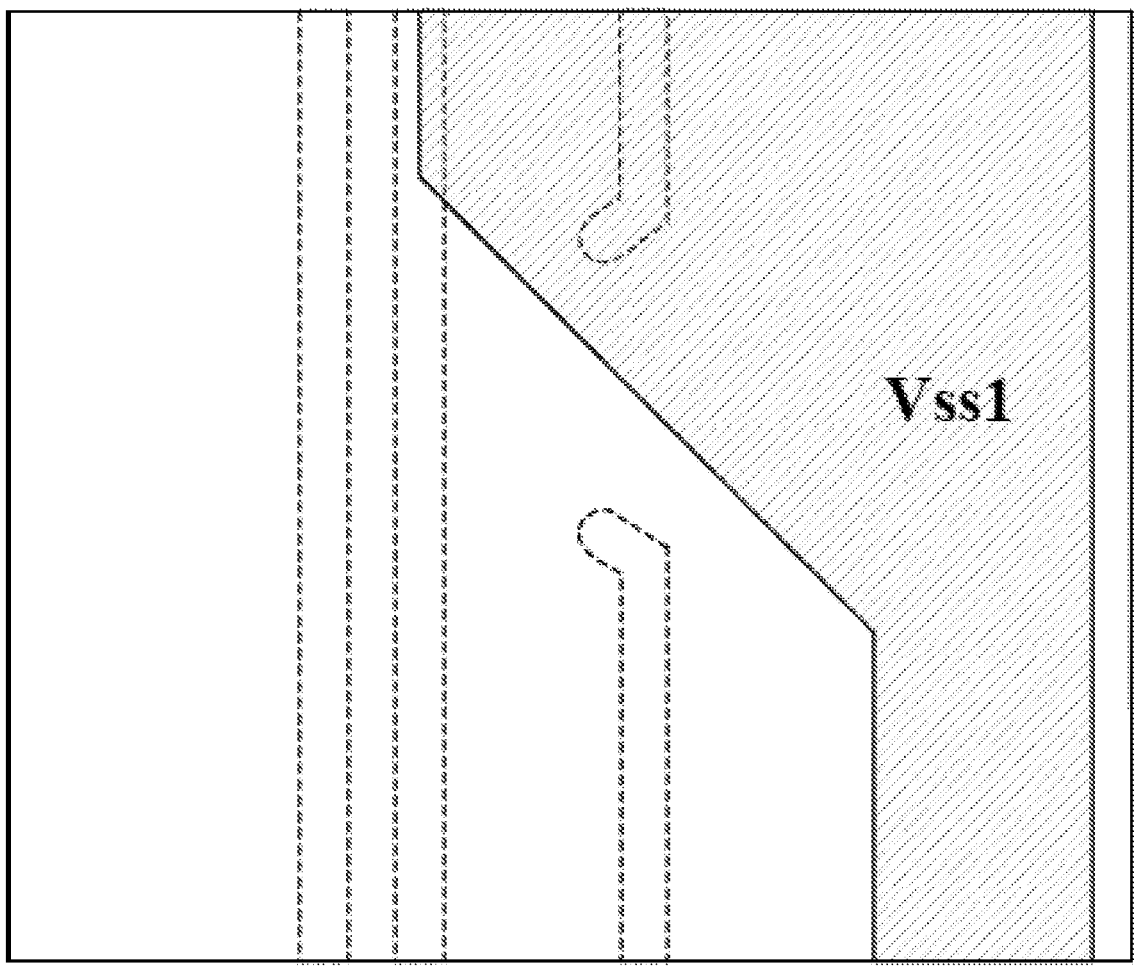
FIG. 6A illustrates an anode material layer in a first zoom-in region in FIG. 2A.

FIG. 6A illustrates an anode material layer in a first zoom-in region in FIG. 2A. Referring to FIG. 6A, FIG. 1E, FIG. 4, and FIG. 5, the display substrate includes a first conductive sub-layer Vss1 of a peripheral voltage supply line in a same layer as the anode material layer AML. Optionally, the peripheral voltage supply line is a signal line configured to provide a low voltage to a cathode of a light emitting diode in the display substrate. The first conductive sub-layer Vss1 of the peripheral voltage supply line is present in the second peripheral sub-area PSA2, and is substantially absent (e.g., at least 80% absent, at least 85% absent, at least 90% absent, at least 95% absent, at least 99% absent, or 100% absent) in the first peripheral sub-area PSA1. Optionally, the first conductive sub-layer Vss1 of the peripheral voltage supply line is completely absent in the first peripheral sub-area PSA1.

Figure 6B:
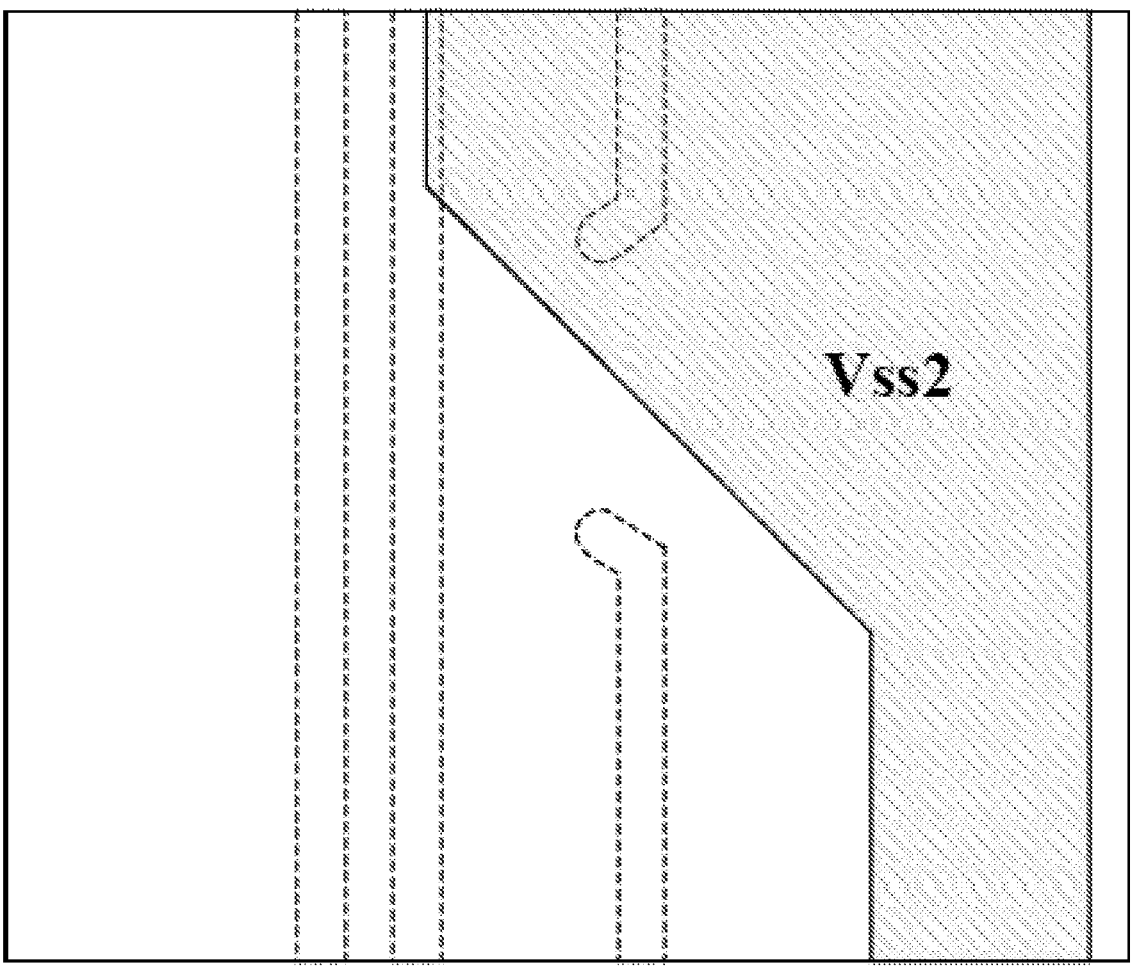
FIG. 6B illustrates a first signal line layer in a first zoom-in region in FIG. 2A.

FIG. 6B illustrates a first signal line layer in a first zoom-in region in FIG. 2A. Referring to FIG. 6B, FIG. 1E, FIG. 4, and FIG. 5, the display substrate includes a second conductive sub-layer Vss2 of a peripheral voltage supply line in a same layer as the first signal line layer SD1. Optionally, the peripheral voltage supply line is a signal line configured to provide a low voltage to a cathode of a light emitting diode in the display substrate. The second conductive sub-layer Vss2 of the peripheral voltage supply line is present in the second peripheral sub-area PSA2, and is substantially absent (e.g., at least 80% absent, at least 85% absent, at least 90% absent, at least 95% absent, at least 99% absent, or 100% absent) in the first peripheral sub-area PSA1. Optionally, the second conductive sub-layer Vss2 of the peripheral voltage supply line is completely absent in the first peripheral sub-area PSA1.

Figure 6C:
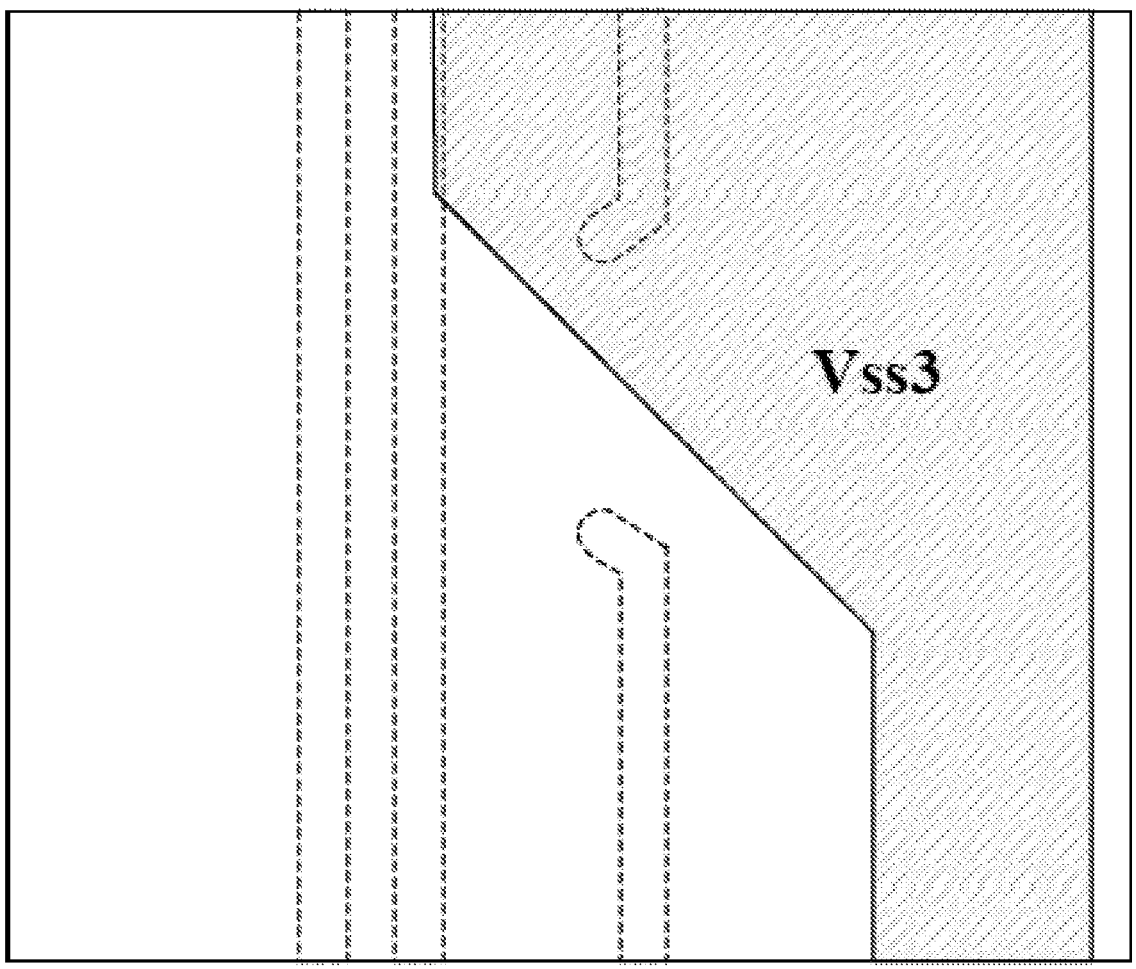
FIG. 6C illustrates a second signal line layer in a first zoom-in region in FIG. 2A.

FIG. 6C illustrates a second signal line layer in a first zoom-in region in FIG. 2A. Referring to FIG. 6C, FIG. 1E, FIG. 4, and FIG. 5, the display substrate includes a third conductive sub-layer Vss3 of a peripheral voltage supply line in a same layer as the second signal line layer SD2. Optionally, the peripheral voltage supply line is a signal line configured to provide a low voltage to a cathode of a light emitting diode in the display substrate. The third conductive sub-layer Vss3 of the peripheral voltage supply line is present in the second peripheral sub-area PSA2, and is substantially absent (e.g., at least 80% absent, at least 85% absent, at least 90% absent, at least 95% absent, at least 99%% absent, or 100% absent) in the first peripheral sub-area PSA1. Optionally, the third conductive sub-layer Vss1 of the peripheral voltage supply line is completely absent in the first peripheral sub-area PSA1.

Figure 6D:
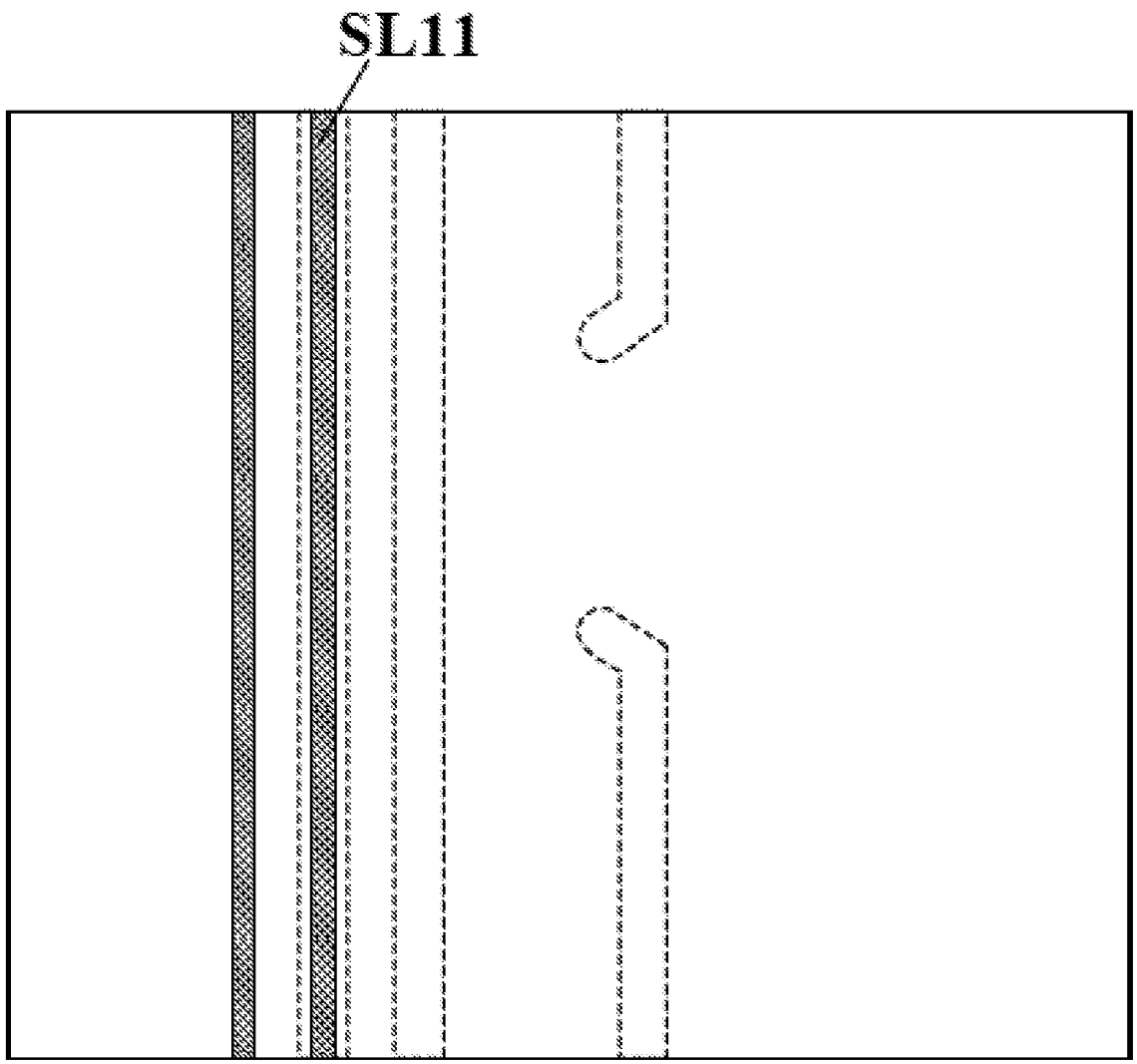
FIG. 6D illustrates a first planarization layer is a first zoom-in region in FIG. 2A.

FIG. 6D illustrates a first planarization layer in a first zoom-in region in FIG. 2A. Referring to FIG. 6D, FIG. 1E, FIG. 4, and FIG. 5, the display substrate includes an eleventh sub-layer SL11 of the fourth barrier layer BAL4, the eleventh sub-layer SL11 being is a same layer as the first planarization layer PLN1. The eleventh sub-layer SL11 is present in the second peripheral sub-area PSA2, and is present in the first peripheral sub-area PSA1.

Figure 6E:
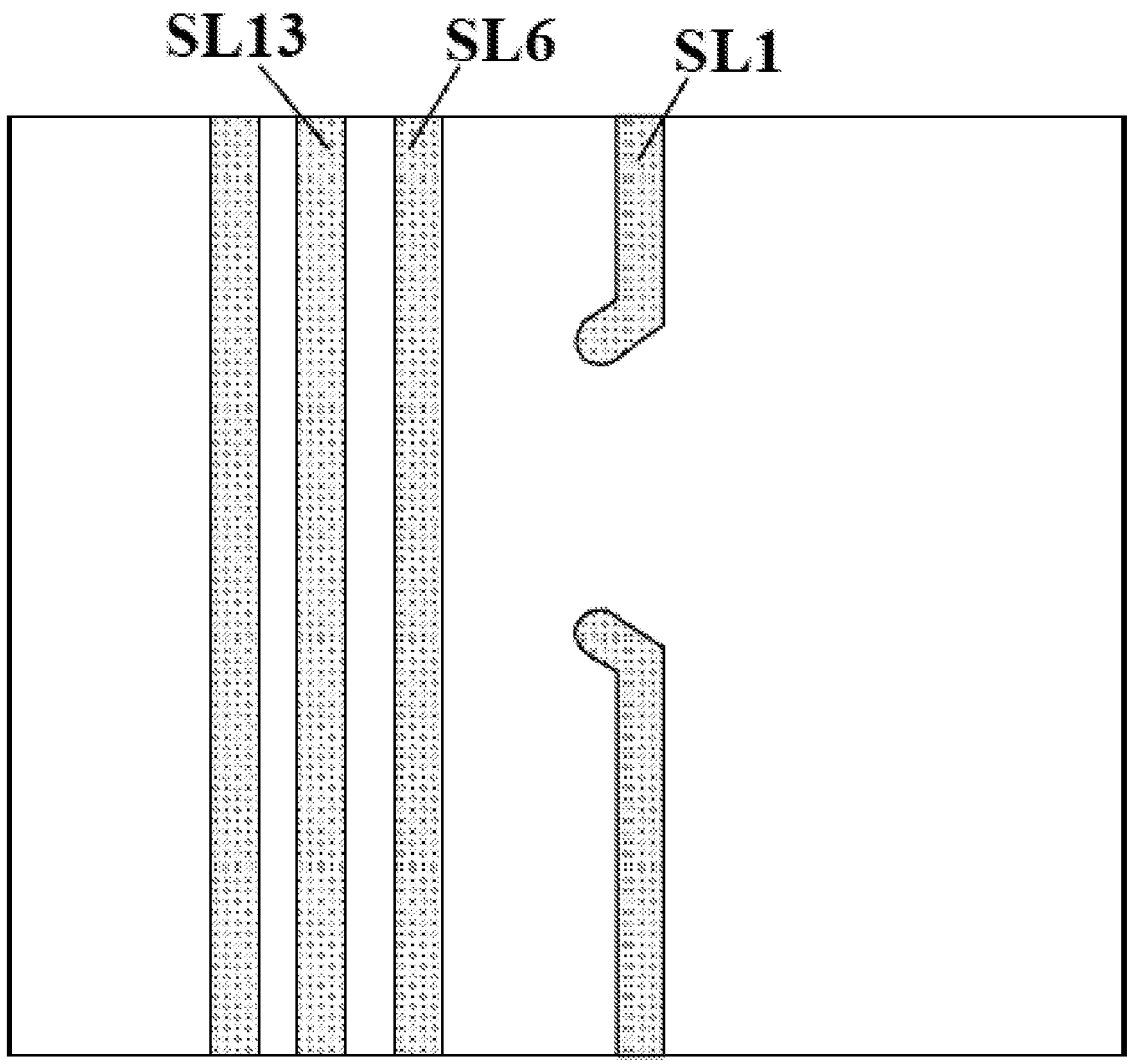
FIG. 6E illustrates a second planarization layer in a first zoom-in region in FIG. 2A.

FIG. 6E illustrates a second planarization layer in a first zoom-in region in FIG. 2A. Referring to FIG. 6E, FIG. 1E, FIG. 4, and FIG. 5, the display substrate includes a thirteenth sub-layer SL13 of the fourth barrier layer BAL4, a sixth sub-layer SL6 of the first barrier layer BAL1, and a first sub-layer SL1 of the third barrier layer BAL3. The thirteenth sub-layer SL13, the sixth sub-layer SL6, and the first sub-layer SL1 are in a same layer as the second planarization layer PLN2. The thirteenth sub-layer SL13 is present is the second peripheral sub-area PSA2, and is present in the first peripheral sub-area PSA1. The sixth sub-layer SL6 is present in the second peripheral sub-area PSA1, and is present in the first peripheral sub-area PSA1. The first sub-layer SL1 is present in the second peripheral sub-area PSA2, and is present in the first peripheral sub-area PSA1.

Figure 6F:
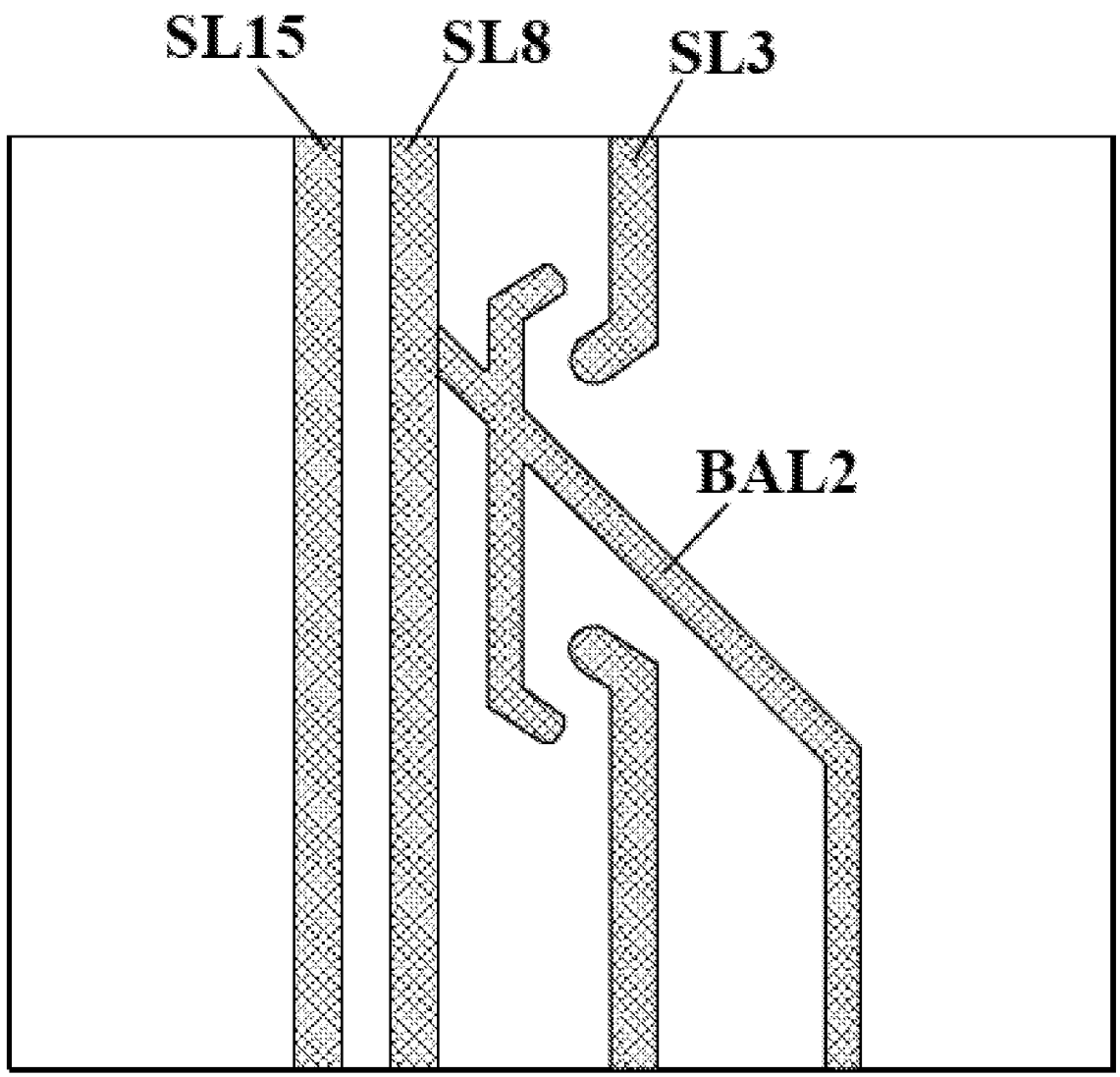
FIG. 6F illustrates a pixel definition layer in a first zoom-in region is FIG. 2A.

FIG. 6F illustrates a pixel definition layer in a first zoom-in region in FIG. 2A. Referring to FIG. 6F, FIG. 1E, FIG. 4, and FIG. 5, the display substrate includes a fifteenth sub-layer SL15 of the fourth barrier layer BAL4, an eighth sub-layer SL8 of the first barrier layer BAL1, a third sub-layer SL3 of the third barrier layer BAL3, and a barrier material layer of the second barrier layer BAL2. The fifteenth sub-layer SL15, the eighth sub-layer SL8, the third sub-layer SL3, and the barrier material layer of the second barrier layer BAL1 are in a same layer as the pixel definition layer PDL. The fifteenth sub-layer SL15 is present in the second peripheral sub-area PSA2, and is present in the first peripheral sub-area PSA1. The eighth sub-layer SL8 is present in the second peripheral sub-area PSA2, and is present in the first peripheral sub-area PSA1. The third sub-layer SL3 is present in the second peripheral sub-area PSA2, and is present in the first peripheral sub-area PSA1.

Figure 6G:
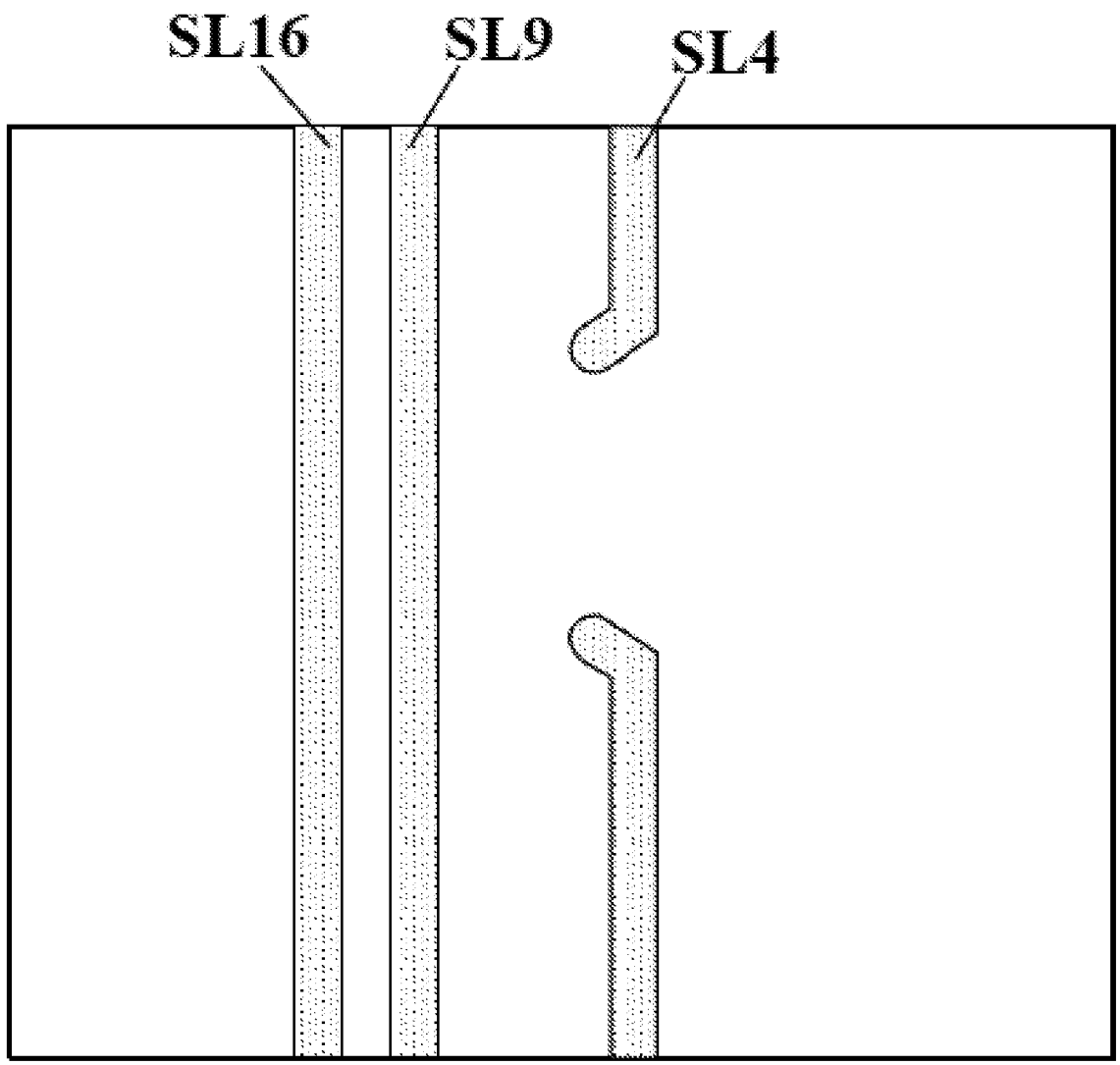
FIG. 6G illustrates a spacer layer in a first zoom-in region in FIG. 2A.

FIG. 6G illustrates a spacer layer in a first zoom-in region in FIG. 2A. Referring to FIG. 6G, FIG. 1E, FIG. 4, and FIG. 5, the display substrate includes a sixteenth sub-layer SL16 of the fourth barrier layer BAL4, a ninth sub-layer SL9 of the first barrier layer BAL1, and a fourth sub-layer SL4 of the third barrier layer BAL3. The sixteenth sub-layer SL16, the ninth sub-layer SL9, and the fourth sub-layer SL4 are in a same layer as the spacer layer. The sixteenth sub-layer SL16 is present in the second peripheral sub-area PSA2, and is present in the first peripheral sub-area PSA1. The ninth sub-layer SL9 is present in the second peripheral sub-area PSA2, and is present in the first peripheral sub-area PSA1. The fourth sub-layer SL4 is present is the second peripheral sub-area PSA2, and is present in the first peripheral sub-area PSA1.

In some embodiments, the display substrate is substantially absent (e.g., at least 80% absent, at least 85% absent, at least 90% absent, at least 95% absent, at least 99% absent, or 100% absent) of any metallic material layer in the first peripheral sub-area PSA1.

Figure 7:
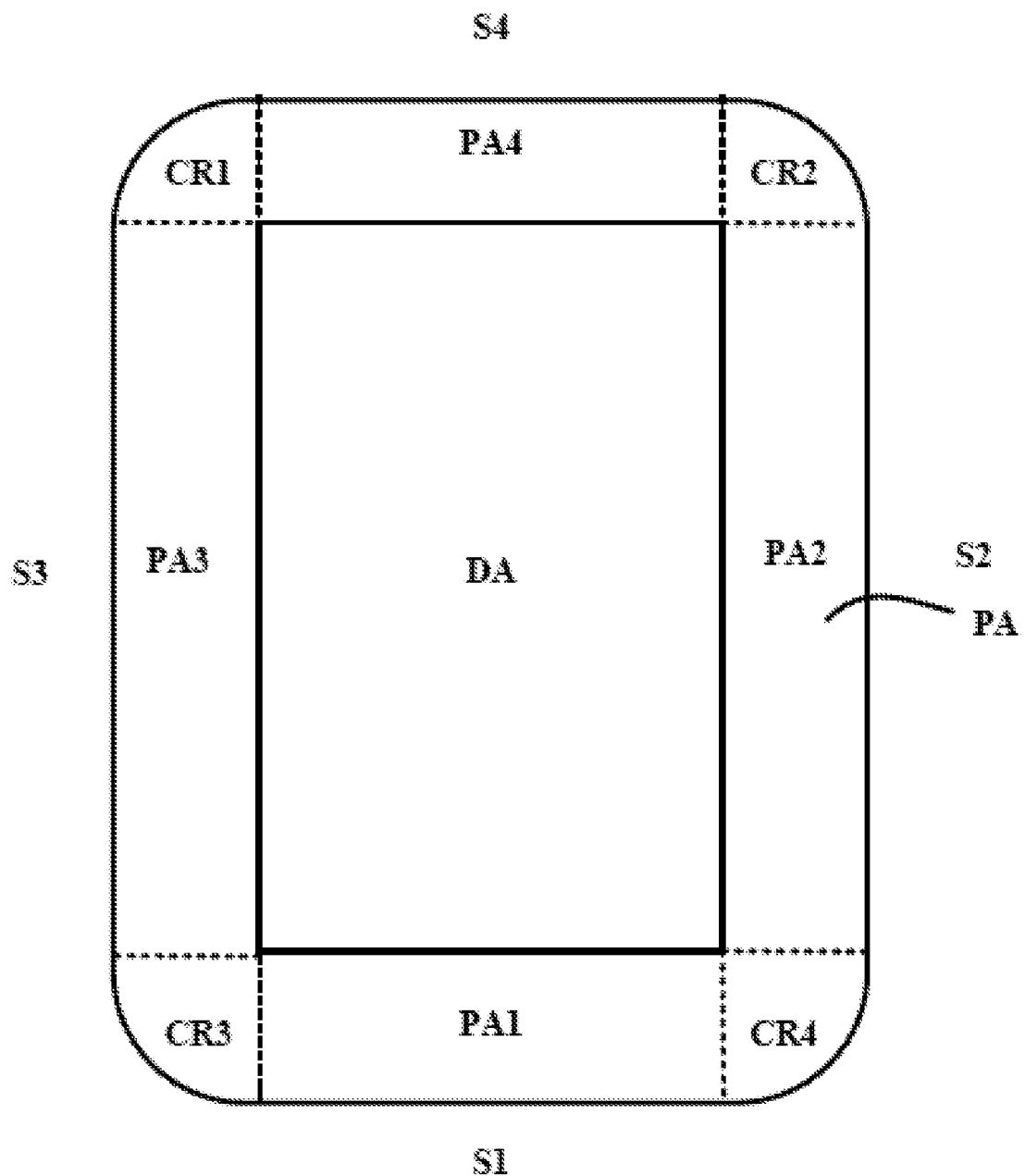
FIG. 7 is a schematic diagram illustrating a display area and a peripheral area in a display substrate in some embodiments according to the present disclosure.

FIG. 7 is a schematic diagram illustrating a display area and a peripheral area in a display substrate in some embodiments according to the present disclosure. Referring to FIG. 7, in some embodiments, the display substrate includes a display areas DA and a peripheral area PA. In some embodiments, the peripheral area PA includes a first side-area PA1 on a first side S1 of the display area DA, a second side-area PA2 on a second side S2 of the display area DA, a third side-area PA3 on a third side S3 of the display area DA, a fourth side-area PA4 on a fourth side S4 of the display area DA. Optionally, the first side S1 and the fourth side S4 are opposite to each other. Optionally, the second side S2 and the third side S3 are opposite to each other. Optionally, the first side-area PA1 includes an integrated circuit bonding region onto which an integrated circuit such as a display control integrated circuit and/or a touch control integrated circuit is bonded. In some embodiments, the peripheral area PA further includes a first corner region CR1 connecting the third side-area PA3 and the fourth side-area PA4, a second corner region CR2 connecting the second side-area PA2 and the fourth side-area PA4, a third corner region CR3 connecting the first side-area PA1 and the third side-area PA3, and a fourth corner region CR4 connecting the first side-area PA1 and the second side-area PA2.

Referring to FIG. 1A, FIG. 1C, and FIG. 7, in some embodiments, the third barrier layer BAL3 is at least partially present in the second side-area PA2, the third side-area PA3, the first corner region CR1, the second corner region CR2, the third corner region CR3, and the fourth corner region CR4. Optionally, the third barrier layer BAL3 is at least partially absent in the first side-area PA1 and the forth side-area PA4.

Referring to FIG. 1A, FIG. 1C, and FIG. 7, in some embodiments, a portion of the third barrier layer BAL3 in a corner region (for example, the second portion P2 or the third portion P3) is spaced apart from a corresponding outer edge of the display substrate by a first spacing distance, and a portion of the third barrier layer BAL3 (e.g., the first portion P1) in the first peripheral sub-area PSA1 is spaced apart from a corresponding outer edge of the display substrate by a second spacing distance. In one example, the first spacing distance is greater than the second spacing distance. In another example, the second spacing distance is greater than the first spacing distance. In another example, the first spacing distance and the second spacing distance are substantially the same.

Figure 8A:
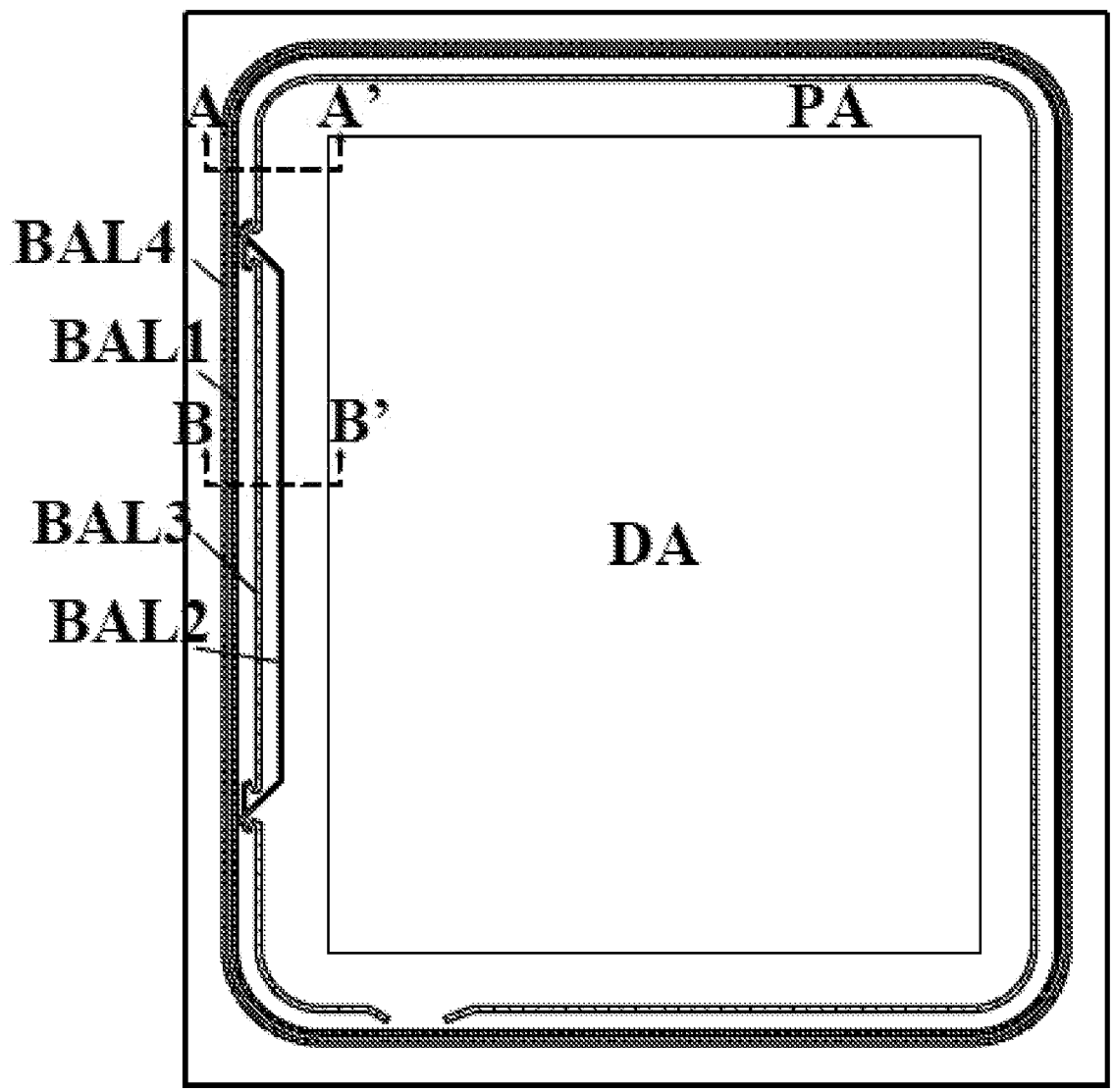
FIG. 8A is a schematic diagram illustrating the structure of a display substrate in some embodiments according to the present disclosure.
Figure 8B:
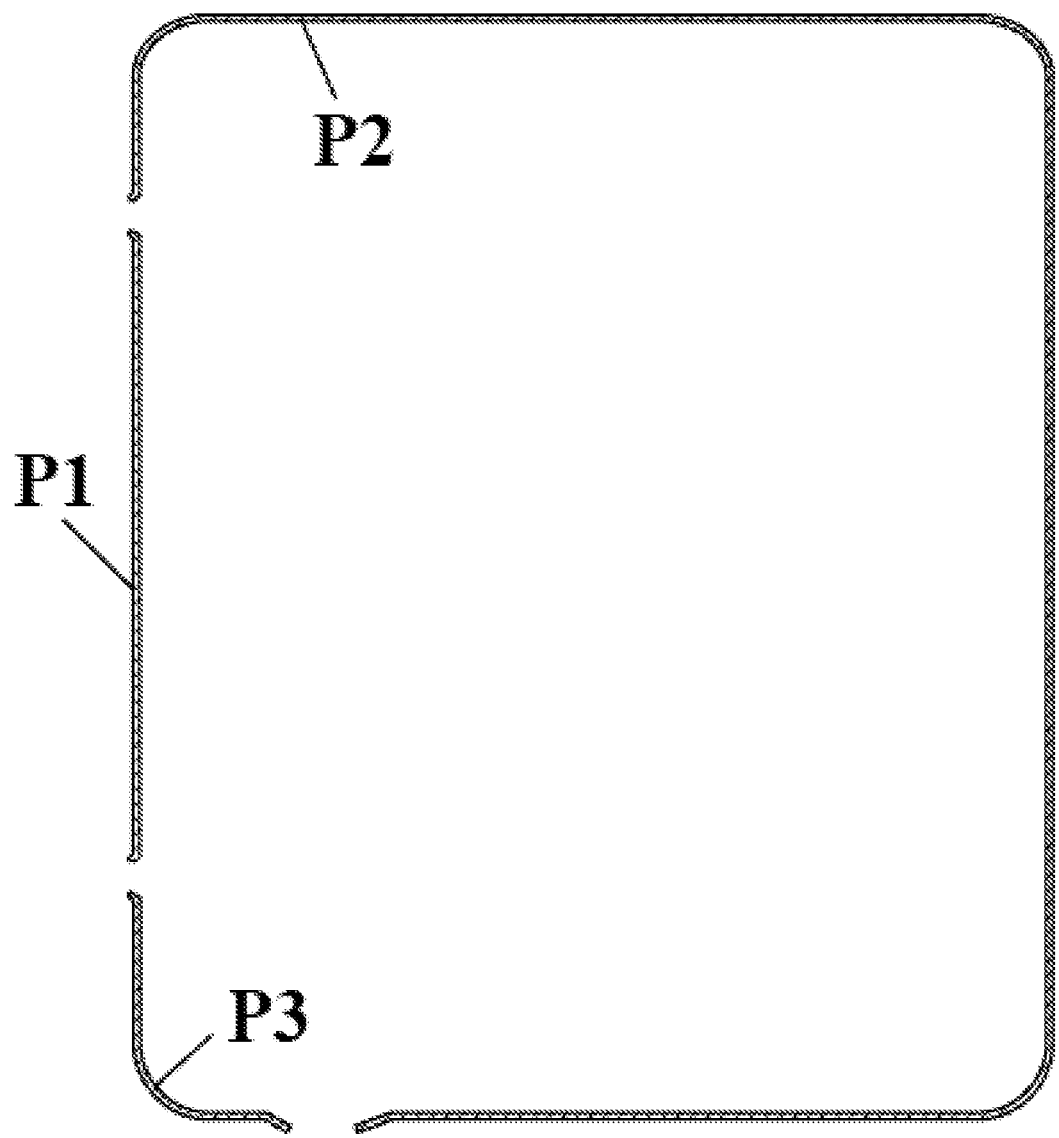
FIG. 8B is a schematic diagram illustrating the structure of a third barrier layer in some embodiments according to the present disclosure.

FIG. 8A is a schematic diagram illustrating the structure of a display substrate in some embodiments according to the present disclosure. FIG. 8B is a schematic diagram illustrating the structure of a third barrier layer in some embodiments according to the present disclosure. Referring to FIG. 8A and FIG. 8B, the third barrier layer BAL3 is at least partially present in each of the first side-area PA1, the second side-area PA2, the third side-area PA3, the fourth side-area PA4, the first corner region CR1, the second corner region CR2, the third corner region CR3, and the fourth corner region CR4.

Figure 9:
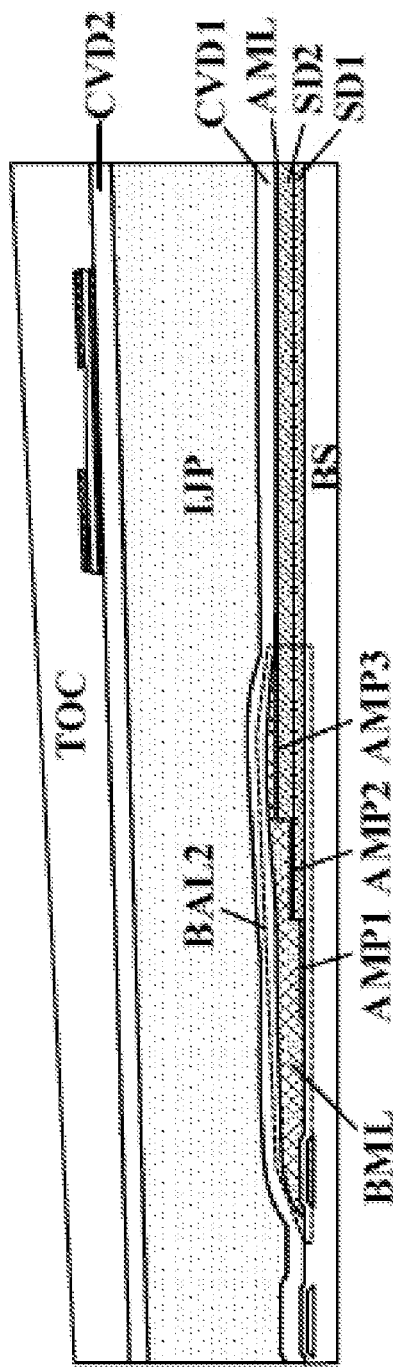
FIG. 9 is a cross-section along a C-C' line in FIG. 3B.

FIG. 9 is a cross-section along a C-C' line in FIG. 3B. Referring to FIG. 9, the second barrier layer BAL2 in some embodiments includes a barrier material layer BML in a same layer as the pixel definition layer. The barrier material layer BML is along an edge of at least a signal line layer such as the first signal line layer SD1, the second signal line layer SD2, or an anode material layer AML. The barrier material layer BML is in contact with at least a signal line layer such as the first signal line layer SD1, the second signal line layer SD2, or an anode material layer AML. Accordingly, is some embodiments, the second barrier layer BAL2 includes a portion of the first signal line layer SD1 on a base substrate BS; a portion of the second signal line layer SD2 on a side of the first signal line layer SD1 away from the base substrate BS; a portion of the anode material layer AML on a side of the second signal line layer SD2 away from the first signal line layer SD1; and a barrier material layer BML on a side of the anode material layer AML away from the second signal line layer SD2.

Referring to FIG. 9, the second barrier layer BAL2 in some embodiments includes a first anode material portion AMP1, a second anode material portion AMP2, and a third anode material portion AMP3. The first anode material portion AMP1, the second anode material portion AMP2, and the third anode material portion AMP3 are parts of the anode material layer AML.

Referring to FIG. 9, the signal line layers in the second barrier layer BAL2 form a step structure, as which a first portion of the first signal line layer SD1 is covered by the second signal line layer SD2, and a second portion of the first signal line layer SD1 is not covered by the second signal line layer SD2. An orthographic projection of the first portion on the base substrate BS at least partially overlaps with an orthographic projection of the third anode material portion AMP3 on the base substrate BS, and is covered by an orthographic projection of the second signal line layer SD2 on the base substrate BS. An orthographic projection of the second portion on the base substrate BS at least partially overlaps with an orthographic projection of the second anode material portion AMP2 on the base substrate BS, and is non-overlapping with the orthographic projection of the second signal line layer SD2 on the base substrate BS.

Figure 10:
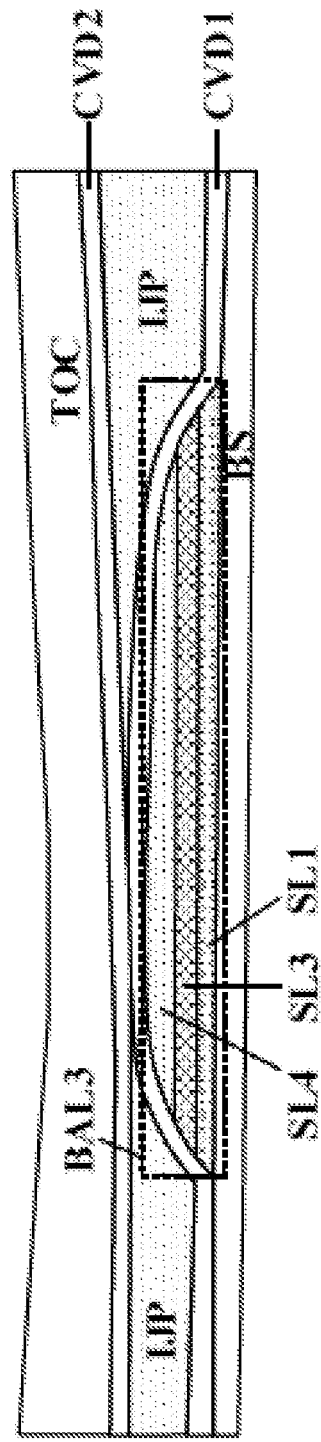
FIG. 10 is a cross-section along a D-D' line in FIG. 3B.

In some embodiments, the first anode material position AMP1 and the second anode material portion AMP2 are at least partially discontinuous portions of the anode material layer AML at least partially segregated due to presence of the first signal line layer SD1 (specifically, the second portion of the first signal line layer SD1), as an edge of the first signal line layer SD1 has a relatively steep slope. In some embodiments, the second anode material portion AMP2 and the third anode material portion AMP3 are at least partially discontinuous portions of the anode material layer AML at least partially segregated due to presence of the second signal line layer SD2 (specifically, the portion of the second signal line layer SD2 covering the first portion of the first signal line layer SD1), as an edge of the second signal line layer SD2 has a relatively steep slope. FIG. 10 is a cross-section along a D-D' line in FIG. 3B. Referring to FIG. 10 and FIG. 1E, in the first peripheral sub-area PSA1, the third barrier layer BAL3 includes a stacked structure including a plurality of sub-layers stacked together. In some embodiments, the plurality of sub-layers of the stacked structure includes a first sub-layer SL1 in a same layer as the second planarization layer PLN2; a third sub-layer SL3 on a side of the first sub-layer SL1 away from the base substrate BS, the third sub-layer SL3 being in a same layer as the pixel definition layer PDL; a fourth sub-layer SL4 on a side of the third sub-layer SL3 away from the first sub-layer SL1, the fourth sub-layer SL4 being in a same layer as a spacer layer.

In some embodiments, the organic encapsulating sub-layer IJP is present in the first sub-area SA1, and is at least partially present in the edge areas EA. In one example as shown in FIG. 10, the display substrate includes a first inorganic encapsulating sub-layer CVD1 on a side of the third barrier layer BAL3 away from the base substrate BS, an organic encapsulating sub-layer IJP on a side of the first inorganic encapsulating sub-layer CVD1 away from the base substrate BS, a second inorganic encapsulating sublayer CVD2 on a side of organic encapsulating sub-layer IJP away from the base substrate BS, and an overcoat layer TOC on a side of the second inorganic encapsulating sub-layer CVD2 away from the base substrate BS.

Figure 11:
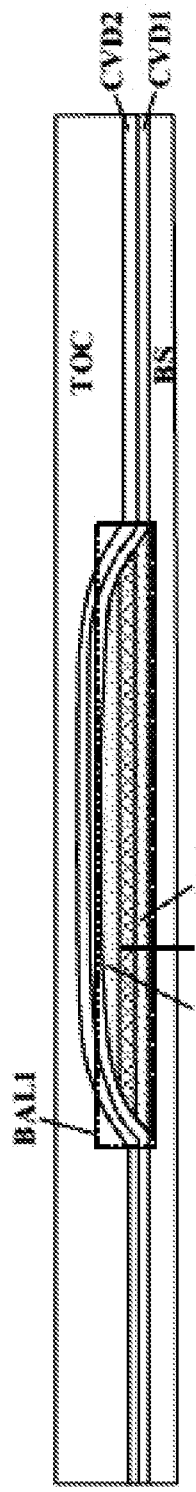
FIG. 11 is a cross-section along a E-E' line in FIG. 3B.

FIG. 11 is a cross-section along a E-E' line in FIG. 3B. Referring to FIG. 11 and FIG. 1E, is the first peripheral sub-area PSA1, the first barrier layer BAL1 includes a stacked structure including a plurality of sub-layers stacked together. In the first peripheral sub-area PSA1, the stacked structure includes a sixth sub-layer SL6 in a same layer as the second planarization layer PLN2; an eighth sub-layer SL8 on a side of the sixth sub-layer SL6 away from the base substrate BS, the eighth sub-layer SL8 being in a same layer as the pixel definition layer PDL; a ninth sub-layer SL9 on a side of the eighth sub-layer SL8 away from the sixth sub-Layer SL6, the ninth sub-layer SL9 being is a same layer as a spacer layer. The display substrate includes a first inorganic encapsulating sub-layer CVD1 on a side of the first barrier layer BAL1 away from the base substrate BS, a second inorganic encapsulating sub-layer CVD2 on a side of the first inorganic encapsulating sub-layer CVD1 away from the base substrate BS, and an overcoat layer TOC on a side of the second inorganic encapsulating sub-layer CVD2 away from the base substrate BS.

Figure 12:
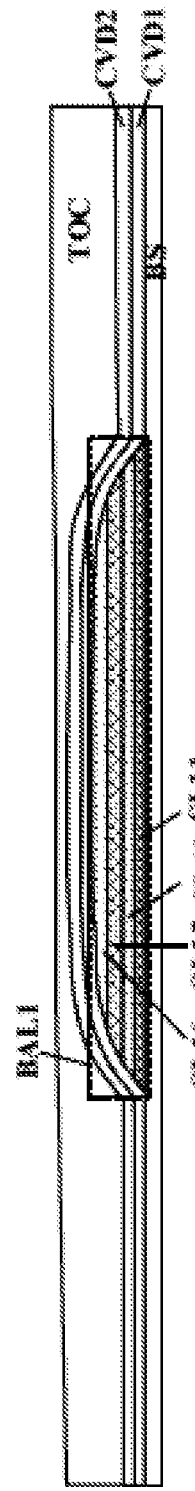
FIG. 12 is a cross-section along an F-F' line in FIG. 3B.

FIG. 12 is a cross-section along an F-F' line in FIG. 3B. Referring to FIG. 12 and FIG. 1E, in the first peripheral sub-area PSA1, the fourth barrier layer BAL4 includes a stacked structure including a plurality of sub-layers stacked together. In the first peripheral sub-area PSA1, the stacked structure includes an eleventh sub-layer SL11 in a same layer as the first planarization layer PLN1; a thirteenth sub-layer SL13 on a side of the eleventh sub-layer SL11 away from the base substrate BS, the thirteenth sub-layer SL15 being in a same layer as the second planarization layer PLN2; a fifteenth sub-layer SL15 on a side of the thirteenth sub-layer SL13 away from the eleventh sub-layer SL11, the fifteenth sub-layer SL15 being in a some layer as the pixel definition layer PDL; a sixteenth sub-layer SL16 on side of the fifteenth sub-layer SL15 away from the thirteenth sub-layer SL13, the sixteenth sub-layer SL16 being in a same layer as a spacer layer. The display substrate includes a first inorganic encapsulating sub-layer CVD1 on a side of the first barrier layer BAL1 away from the base substrate BS, a second inorganic encapsulating sub-layer CVD2 on a side of the first inorganic encapsulating sub-layer CVD1 away from the base substrate BS, and an overcoat layer TOC on a side of the second inorganic encapsulating sub-layer CVD2 away from the base substrate BS.

Figure 13:
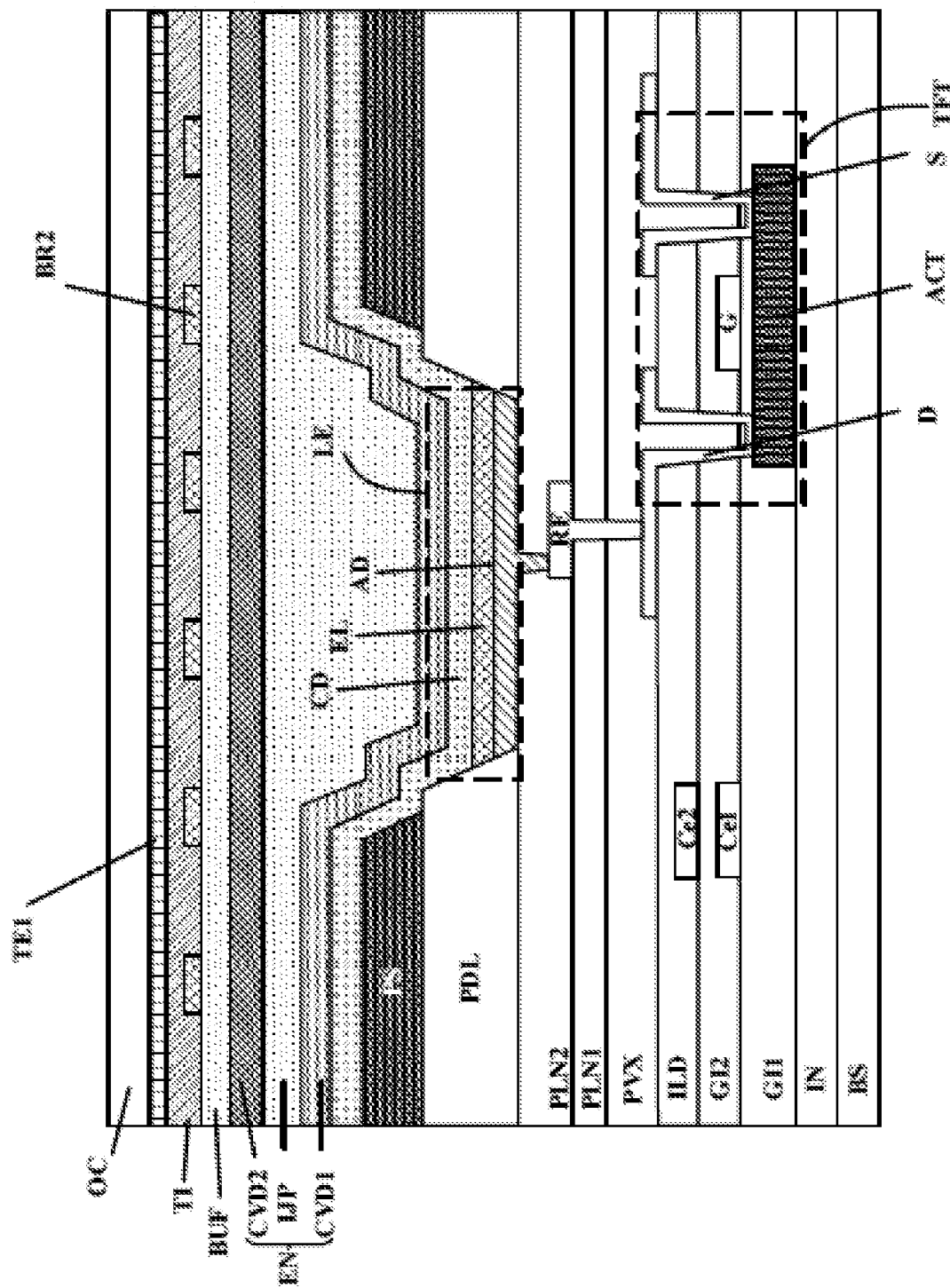
FIG. 13 illustrates a detailed structure of a display substrate in a display area in some embodiments according to the present disclosure.

FIG. 13 illustrates a detailed structure of a display substrate in a display area in some embodiments according to the present disclosure. Referring to FIG. 13, the display substrate in the display area in some embodiments includes a base substrate BS (e.g., a flexible base substrate); an insulating layer IN on the base substrate BS; as active laves ACT of a respective one of a plurality of thin film transistors TFT on a side of the insulating layer IN away from the base substrate BS; a first gate insulating layer GI1 on a side of the active layer ACT away from the base substrate BS; a gate electrode G and a first capacitor electrode Ce1 (both are parts of a first gate metal layer) on a side of the first gate insulating layer GI1 away from the insulating layer IN; a second gate insulating layer GI2 on a side of the gate electrode G and the first capacitor electrode Ce1 away from the first gate insulating layer GI1; a second capacitor electrode Ce2 (a part of a second gate metal layer) on a side of the second gate insulating layer GI2 away from the first gate insulating layer GI1; as inter-layer dielectric layer ILD on a side of the second capacitor electrode Ce1 away from the second gate insulating layer GI2; a source electrode S and a drain electrode D (parts of a first SD metal layer) on a side of the inter-layer dielectric layer ILD away from the second gate insulating layer GI2; a passivation layer PVX on a side of the source electrode S and the drain electrode D away from the inter-layer dielectric layer ILD; a first planarization layer PLN1 on a side of the passivation layer PVX away from the inter-layer dielectric layer ILD; a second planarization layer PLN2 on side of the first planarization layer PLN1 away from the passivation layer PVX; a relay electrode RE (part of a second SD metal layer) on a side of the second planarization layer PLN2 away from the first planarization layer PLN1; a pixel definition layer PDL defining a subpixel aperture and on a side of the second planarization layer PLN2 away from the base substrate BS; and a light emitting element LE in the subpixel aperture. The light emitting element LE includes an anode AD on a side of the second planarization layer PLN2 away from the first planarization layer PLN1; a light emitting layer EL on a side of the anode AD away from the second planarization layer PLN2, and a cathode layer CD on a side of the light emitting layer EL away from the anode AD.

In some embodiments, the display substrate in the display area further includes a spacer layer PS on a side of the pixel definition layer PDL away from the second planarization layer PLN2. In some embodiments, the cathode layer CD is unitary structure extending throughout a plurality of subpixels. Optionally, the cathode layer CD is on a side of the spacer layer PS away from the pixel definition layer PDL. In the display area, the spacer layer PS and the pixel definition layer PDL are in the inter-subpixel region.

In some embodiments, the display substrate in the display area further includes an encapsulating layer EN encapsulating the light emitting element LE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer IJP away from the first inorganic encapsulating sub-layer CVD1. The display substrate in the display area further includes a buffer layer BUF on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF, and an overcoat layer OC on a side of the plurality of first touch electrodes TE1 away from the touch insulating layer TI. Optionally, the display substrate in the display area does not include the passivation layer PVX, e.g., the inter-layer dielectric layer ILD is in direct contact with the first planarization layer PLN1.

In another aspect, the present invention provides a display substrate. In some embodiments, the display substrate includes at least two barrier layers in a peripheral area of the display substrate. Referring to FIG. 1A, in some embodiments, the at least two barrier layers include a first barrier layer BAL1 forming an enclosure; and a third barrier layer BAL3 on a side of the first barrier layer BAL1 closer to a display area DA. The third barrier layer BAL3 includes one or more discontinuous portions (e.g., P1, P2, P3 as shown in FIG. 1C).

Referring to FIG. 1C, the third barrier layer BAL3 in some embodiments includes at least a first portion P1. The first portion P1 is in a peripheral sub-area in which at least a signal line layer is absent (for example, the first peripheral sub-area PSA1 in FIG. 1E). Optionally, the first portion P1 is in a peripheral sub-area in which a first signal line layer SD1, a second signal line layer SD2, and an anode material layer AML are absent. Referring to FIG. 6A to FIG. 6C, FIG. 5, FIG. 10, and FIG. 1E, signal line layers (e.g., SD1, SD2, AML, Vss1, Vss2, or Vss3) are absent in the first peripheral sub-area PSA1.

Referring to FIG. 1C, the third barrier layer BAL3 in some embodiments further includes at least a second position P2 outside the peripheral sub-area (e.g., outside the first peripheral sub-area PSA1 in FIG. 1E). Referring to FIG. 1A, FIG. 1C, FIG. 4, and FIG. 5, the first portion P1 and the second portion P2 each includes at least one common insulating sub-layer (e.g., SL1, SL3, and SL4). The second portion P2 includes at least one metallic sub-layer (e.g., SL2 and SL5) that is absent is the first portion P1.

Referring to FIG. 2A and FIG. 2B, in some embodiments, the display substrate includes a staggered structure. The staggered structure includes at least a portion of the third barrier layer (e.g., ESG1 and MSG1 in FIG. 2B) and at least one branch barrier (e.g., BB1 in FIG. 2B). The portion of the third barrier layer (e.g., ESG1 and MSG1 in FIG. 2B) and the at least one branch barrier (e.g., BB1 in FIG. 2B) are staggered with respect to each other.

Referring to FIG. 1A, the display substrate in some embodiments further includes a second barrier layer BAL2 in the peripheral area PA. Referring to FIG. 1A, FIG. 2A, and FIG. 2B, the staggered structure in some embodiments further includes a portion of the second barrier layer BAL2 (e.g., the portion of the second barrier layer BAL2 connected to the first branch barrier BB1). The at least one branch barrier (e.g., BB1 or BB2 in FIG. 2B) is connected to and extending away from the second barrier layer BAL2.

In some embodiment, referring to FIG. 1C, the third barrier layer BAL3 includes at least a first position P1 and a second portion P2 discontinued from each other. The portion (e.g., the portion of the second barrier layer BAL2 connected to the first branch barrier BB1 or the first branch barrier BB2) of the second barrier layer BAL2 that is part of the staggered structure is in a region between the first portion P1 and the second portion P2 where the third barrier layer BAL3 is discontinued.

In some embodiments, the at least one branch barrier includes a first branch barrier BB1 and a second branch barrier BB2 respectively connected to and extending away from the portion of the second barrier layer BAL2 that is part of the staggered structure. Referring to FIG. 2B, in the staggered structure, the first portion P1 and the first branch barrier BB1 are staggered with respect to each other; and the second portion P2 and the second branch barrier BB2 are staggered with respect to each other.

In some embodiments, the display substrate further includes a second barrier layer BAL2 in the peripheral area PA. The third barrier layer BAL3 includes at least a first portion P1. Referring to FIG. 2A and FIG. 2B, is some embodiments, the first portion P1 is between a portion of the first barrier layer BAL1 and the second barrier layer BAL2. Optionally, the second barrier layer BAL2 is connected to the first barrier layer BAL1; and the second barrier layer BAL2 and the portion of the first barrier layer BAL1 form a sub-enclosure enclosing the first portion P1.

Referring to FIG. 5 and FIG. 9, in some embodiments, the second barrier layer BAL2 is along an edge of at least a signal line layer (e.g., SD1, SD2, AML in FIG. 9); and the second barrier layer BAL2 is in contact with the signal line layer.

Referring FIG. 2A and FIG. 2B, the display substrate further includes at least one branch barrier connected to and extending away from the second barrier layer BAL2. A respective branch barrier (e.g., the first branch barrier BB1) includes a first segment SG1 and a second segment SG2. Extensions directions of the first segment SG1 and the second segment SG2 are different from each other. The third barrier layer BAL3 includes a first end segment ESG1 and a first main segment MSG1. Extension directions of the first end segment ESG1 and the first main segment MSG1 are different from each other. Extension directions of the first segment SG1 and the first main segment MSG1 are substantially parallel to each other. Extension directions of the second segment SG2 and the first end segment ESG1 are substantially parallel to each other.

Referring FIG. 2A and FIG. 2B, in some embodiments, in plan view of the display substrate, as extension direction of the second segment SG2 is more toward the first main segment MSG1 relative to an extension of the first segment SG1. Optionally, in plan view of the display substrate, an extension direction of the first end segment ESG1 is more toward the first segment SG1 relative to an extension direction of the first main segment MSG1.

Referring to FIG. 1A, in some embodiments, the display substrate further includes at least a first branch barrier BB1 and a second branch barrier BB2 connected to and extending away from the second barrier layer BAL2, respectively. Referring to FIG. 1A and FIG. 2B, the first branch barrier BB1 is inside a sub-enclosure formed by the second barrier layer BAL2 and the portion of the first barrier layer BAL1 enclosing the first portion P1. The second branch barrier BB2 is outside the sub-enclosure. Optionally, extension lengths of the first branch barrier BB1 and the second branch barrier BB2 are different from each other.

In some embodiments, the first barrier layer BAL1 includes at least a first-first barrier portion (e.g., the portion crossed over by the A-A' line in FIG. 1A) and a second-first barrier portion (e.g., the portion crossed over by the B-B' line in FIG. 1A). Referring to FIG. 4 and FIG. 5, the first-first barrier portion and the second-first barrier portion each includes a plurality of common insulating sub-layers (e.g., SL6, SL8, and SL9 in FIG. 4 and FIG. 5); and the second-first barrier portion includes at least one metallic sub-layer (e.g., SD1, SD2, and AML in FIG. 4) that is absent in the first-first barrier position. Optionally, the first-first barrier portion and a second barrier layer BAL2 form a sub-enclosure enclosing a first position P1 of the third barrier layer BAL3.

In some embodiments, the third barrier layer BAL1 includes a first portion P1, a second portion P2, and a third portion P3. Referring to FIG. 1A and FIG. 1C, the first portion P1 is spaced apart from the second portion P2 by the second barrier layer BAL2, and spaced apart from the third portion P3 by the second barrier layer BAL2.

In some embodiments, the second portion P2 and the third portion P3 are at least partially in two corner regions of the display substrate, respectively. Referring to FIG. 1C and FIG. 7, in one example, the second portion P2 is at least partially in the first corner region CR1, and the third portion P3 is at least partially in the first corner region CR3.

Referring to FIG. 1B, the display substrate in some embodiments includes one or more branch barriers (BB1 or BB2) connected to and extending away from a portion of the second barrier layer BAL2 where the first position P1 is spaced apart from the second portion P2; and one or wore branch barriers (BB3 or BB4) connected to and extending away from a portion of the second barrier layer BAL2 where the first position P1 is spaced apart from the third position P3.

In another aspect, the present invention provides a display apparatus, comprising the display substrate described herein or fabricated by a method described herein, and one or more integrated circuits connected to the display substrate. Optionally, the display apparatus is an organic light emitting diode display apparatus. Optionally, the display apparatus is an electrophoretic display apparatus. Examples of appropriate display apparatuses include, but are not limited to, an electronic paper, a mobile phone, a tablet computer, a television, a monitor, a notebook computer, a digital album, a GPS, etc.

In some embodiments, the display apparatuses further includes a sensor at least partially is the first peripheral sub-area. Various appropriate sensors may be disposed in the first peripheral sub-area. Examples of sensors include a fingerprint sensor, a light sensor, and a voice sensor.

In another aspect, the present invention provides a method of fabricating a display substrate. In some embodiments, the method includes forming an encapsulating layer encapsulating a display unit in a display area; forming a first barrier layer in a peripheral area of the display substrate, the first barrier layer forming a first enclosure enclosing a first area, the first area comprising the display area; and forming a second barrier layer in the peripheral area. Optionally, the second barrier layer is formed to be connected to the first barrier layer, partitioning the first area into a first sub-area entirely in the peripheral area and a second sub-area partially in the peripheral area and partially in the display area, the second barrier layer and a portion of the first barrier layer enclosing the first sub-area.

In some embodiments, the method further includes printing an ink comprising an organic encapsulating material on the display substrate, and dying the ink to form an organic encapsulating material sub-layer of the encapsulating layer. Is some embodiments, the ink is printed so that the ink is substantially contained in the second sub-area (SA2 in FIG. 1B) of the first area (A1 is FIG. 1B). By having the organic encapsulating material sub-layer contained in the second sub-area, the display substrate can still maintain a relatively excellent water-resistance and oxygen-resistance even if cracks of a small degree occurs in the second inorganic encapsulating material sub-layer. This is because the organic encapsulating material sub-layer is absent in the region having the cracks (e.g., between the first barrier layer and the fourth barrier layer), and water/oxygen is not prone to permeate into the display substrate absent of an organic material.

In some embodiments, the method further includes forming a third barrier layer in the peripheral area. Optionally, forming the third barrier layer includes forming at least a first portion. The first portion is enclosed in the first sub-area. The first portion is spaced apart from the second barrier layer and spaced apart from the first barrier layer. By having a third barrier layer in combination with the second barrier layer, the flow of the organic encapsulating material ink during the printing process can be stably controlled. In particular, a more planar organic encapsulating material sub-layer can be consistently formed in the peripheral area. By having a more planar organic encapsulating material sub-layer, the slope of an edge of the organic encapsulating material sub-layer in the peripheral area can be much reduced. The touch electrode layer formed near the edge of the organic encapsulating material sub-layer can be more reliably fabricated, avoiding line open or short issues in the touch electrode layer, particularly when the touch electrode is made of mesh lines.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the terms "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising:
   at least two barrier layers in a peripheral area of the display substrate;
   a second barrier layer in the peripheral area; and
   at least one branch barrier connected to and extending away from the second barrier layer;
   wherein the at least two barrier layers comprise:
   a first barrier layer forming an enclosure; and
   a third barrier layer on a side of the first barrier layer closer to a display area;
   wherein the third barrier layer comprises one or more discontinuous portions;
   wherein the third barrier layer comprises at least a first portion; and
   the first portion is between a portion of the first barrier layer and the second barrier layer;
   wherein a respective branch barrier comprises a first segment and a second segment; and
   extension directions of the first segment and the second segment are different from each other;
   wherein the third barrier layer comprises a first end segment and a first main segment; and
   extension directions of the first end segment and the first main segment are different from each other;
   wherein extension directions of the first segment and the first main segment are substantially parallel to each other; and
   extension directions of the second segment and the first end segment are substantially parallel to each other;

wherein in plan view of the display substrate, an extension direction of the second segment is more toward the first main segment relative to an extension direction of the first segment; and in plan view of the display substrate, an extension direction of the first end segment is more toward the first segment relative to an extension direction of the first main segment.

2. The display substrate of claim 1, wherein the third barrier layer comprises at least a first portion; and the first portion is in a peripheral sub-area in which at least a signal line layer is absent.

3. The display substrate of claim 2, wherein the first portion is in a peripheral sub-area in which a first signal line layer, a second signal line layer, and an anode material layer are absent.

4. The display substrate of claim 2, wherein the third barrier layer further comprises at least a second portion outside the peripheral sub-area;

the first portion and the second portion each comprises at least one common insulating sub-layer; and the second portion comprises at least one metallic sub-layer that is absent in the first portion.

5. The display substrate of claim 1, comprising a staggered structure;

wherein the staggered structure comprises at least a portion of the third barrier layer and at least one branch barrier; and the portion of the third barrier layer and the at least one branch barrier are staggered with respect to each other.

6. The display substrate of claim 5, further comprising a second barrier layer in the peripheral area;

wherein the staggered structure further comprises a portion of the second barrier layer; and the at least one branch barrier connected to and extending away from the second barrier layer.

7. The display substrate of claim 6, wherein the third barrier layer comprises at least a first portion and a second portion discontinued from each other; and the portion of the second barrier layer that is part of the staggered structure is in a region between the first portion and the second portion where the third barrier layer is discontinued.

8. The display substrate of claim 7, wherein the at least one branch barrier comprises a first branch barrier and a second branch barrier respectively connected to and extending away from the portion of the second barrier layer that is part of the staggered structure;

wherein, in the staggered structure, the first portion and the first branch barrier are staggered with respect to each other; and the second portion and the second branch barrier are staggered with respect to each other.

9. The display substrate of claim 1, wherein the second barrier layer is connected to the first barrier layer; and the second barrier layer and the portion of the first barrier layer form a sub-enclosure enclosing the first portion.

10. The display substrate of claim 6, wherein the second barrier layer is along an edge of at least a signal line layer; and the second barrier layer is in contact with the signal line layer.

11. The display substrate of claim 1, further comprises at least a first branch barrier and a second branch barrier connected to and extending away from the second barrier layer, respectively;

wherein the first branch barrier is inside a sub-enclosure formed by the second barrier layer and the portion of the first barrier layer enclosing the first portion; and the second branch barrier is outside the sub-enclosure.

12. The display substrate of claim 1, further comprises at least a first branch barrier and a second branch barrier connected to and extending away from the second barrier layer, respectively;

wherein extension lengths of the first branch barrier and the second branch barrier are different from each other.

13. The display substrate of claim 1, wherein the first barrier layer comprises at least a first-first barrier portion and a second-first barrier portion;

the first-first barrier portion and the second-first barrier portion each comprises a plurality of common insulating sub-layers; and the second-first barrier portion comprises at least one metallic sub-layer that is absent in the first-first barrier portion.

14. The display substrate of claim 13, wherein the first-first barrier portion and a second barrier layer form a sub-enclosure enclosing a first portion of the third barrier layer.

15. The display substrate of claim 1, further comprising a second barrier layer in the peripheral area;

wherein the third barrier layer comprises a first portion, a second portion, and a third portion; and the first portion is spaced apart from the second portion by the second barrier layer, and spaced apart from the third portion by the second barrier layer.

16. The display substrate of claim 15, wherein the second portion and the third portion are at least partially in two corner regions of the display substrate, respectively;

wherein the display substrate further comprises:

one or more branch barriers connected to and extending away from a portion of the second barrier layer where the first portion is spaced apart from the second portion; and one or more branch barriers connected to and extending away from a portion of the second barrier layer where the first portion is spaced apart from the third portion.

17. A display apparatus, comprising the display substrate of claim 1, and one or more integrated circuits connected to the display substrate.

* * * * *